(12) United States Patent
Penn et al.

(10) Patent No.: US 6,169,605 B1
(45) Date of Patent: Jan. 2, 2001

(54) METHOD AND APPARATUS FOR THE COMPUTER-CONTROLLED MANUFACTURE OF THREE-DIMENSIONAL OBJECTS FROM COMPUTER DATA

(75) Inventors: Steven M. Penn, Plano; David N. Jones, Dallas; Michael E. Embree, The Colony, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 08/301,508

(22) Filed: Sep. 7, 1994

Related U.S. Application Data

(63) Continuation of application No. 07/923,278, filed on Jul. 31, 1992, which is a continuation-in-part of application No. 07/905,069, filed on Jun. 24, 1992, now Pat. No. 5,260,009, which is a continuation of application No. 07/648,081, filed on Jan. 31, 1991, now abandoned.

(51) Int. Cl.⁷ .................................................. G06F 15/00
(52) U.S. Cl. ............................................. 358/1.1; 358/1.8
(58) Field of Search ........................... 395/101, 119, 395/120, 125; 364/468, 474.05, 479, 476, 468.01–468.28, 479.01–479.14, 476.01; 264/129, 131, 132; 358/1.1; 345/419, 420, 425

(56) References Cited

U.S. PATENT DOCUMENTS

| | | | |
|---|---|---|---|
| 4,641,270 | * 2/1987 | Lalloz et al. | 364/476 |
| 4,665,492 | * 5/1987 | Masters | 364/468 |
| 5,031,120 | * 7/1991 | Pomerantz et al. | 364/522 |
| 5,134,569 | * 7/1992 | Masters | 364/474.24 |
| 5,136,515 | * 8/1992 | Helinski | 364/468 |
| 5,350,477 | * 9/1994 | Chevalier et al. | 156/250 |

\* cited by examiner

*Primary Examiner*—Dov Popovici
(74) *Attorney, Agent, or Firm*—W. Daniel Swayze, Jr.; Wade James Brady, III; Frederick J. Telecky, Jr.

(57) ABSTRACT

A method and process for computer-controlled manufacture of three-dimensional objects involves dispensing a layer of a first material, such as a liquid, insoluble material onto a platform at predetermined locations corresponding to a cross-section of the object, which then hardens. A second medium, preferably water soluble, is then sprayed onto this layer to thereby encapsulate the hardened insoluble media. The uppermost surface of this encapsulant is planarized, if necessary, for example by way of a mill cutter, knife, roller or thermal bar, thus removing a portion of the encapsulant to expose the underlying insoluble material for new pattern deposition. The dispensing of the first and second materials, and the planarization, may be performed in a single pass by an integrated printhead. After the resulting planing residue is removed, another layer of liquid, insoluble medium is dispensed onto the planed surface. These steps are repeated, until the desired three-dimensional object, surrounded by a mold, is completed. At this point, the object is either heated or immersed in a solvent, thereby dissolving the mold and leaving the three-dimensional object intact; alternatively, the second material may remain in place to form a composite structure such as a printed circuit board. A method is also disclosed which converts a CAD data base representing a solid object into one representing a filled shell, reducing the amount of object material required.

14 Claims, 13 Drawing Sheets

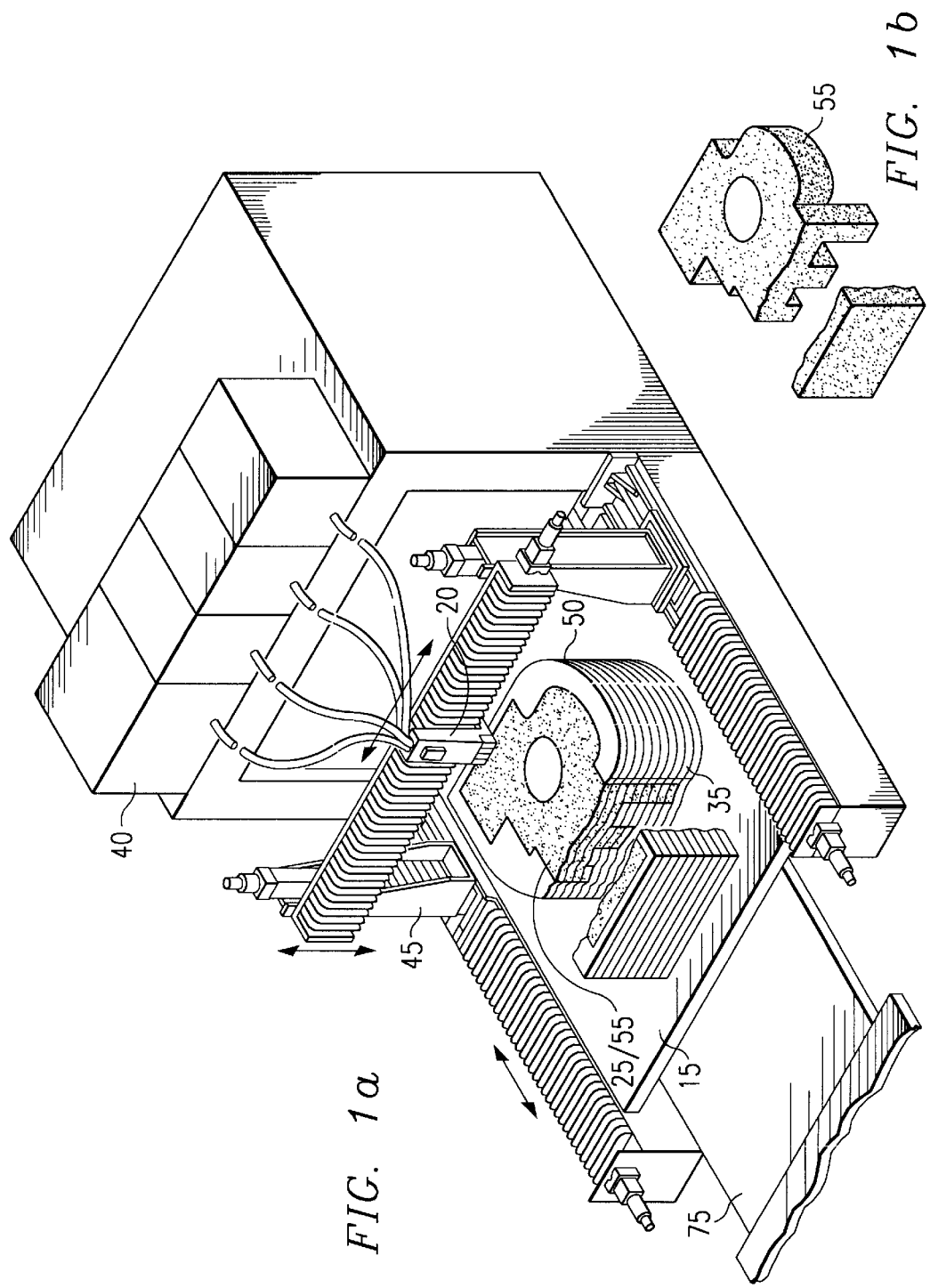

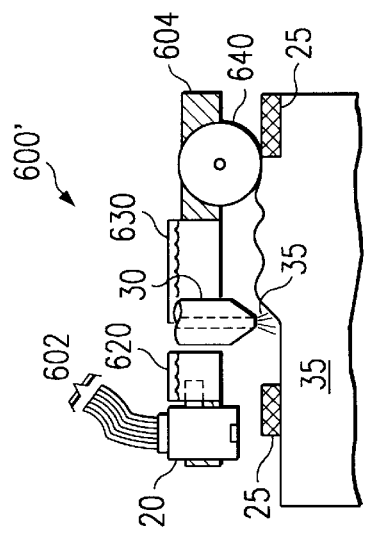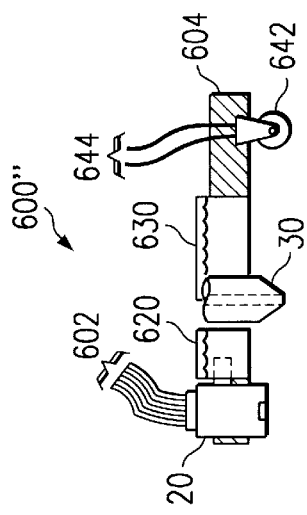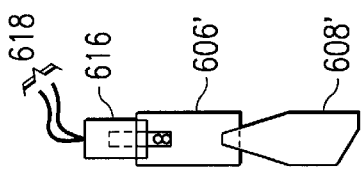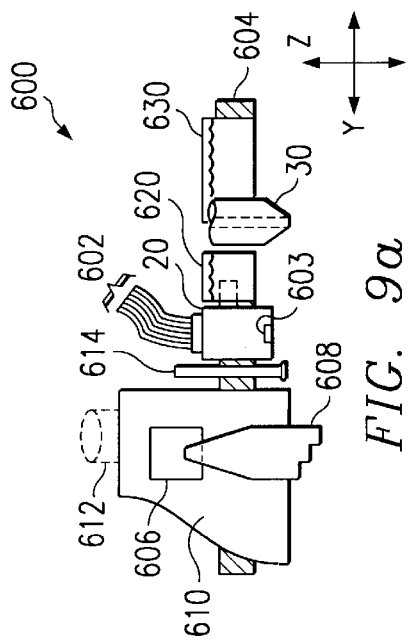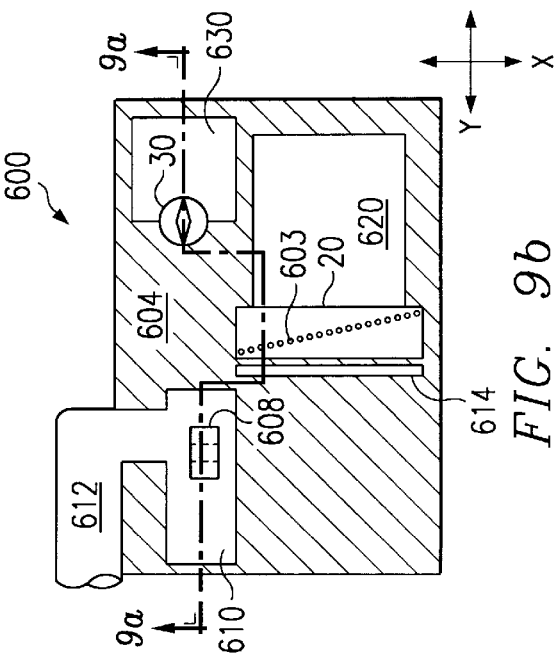

METHOD AND APPARATUS FOR THE COMPUTER-CONTROLLED MANUFACTURE OF THREE-DIMENSIONAL OBJECTS FROM COMPUTER DATA

This is a continuation, of application Ser. No. 07/923,278, filed Jul. 31, 1992.

This application is a continuation-in-part of application Ser. No. 07/905,069, filed Jun. 24, 1992 now U.S. Pat. No. 5,260,009, which is a continuation of application Ser. No. 07/648,081, filed Jan. 31, 1991, now abandoned.

BACKGROUND OF THE INVENTION

1. Field of the Invention

Without limiting its scope, this invention relates to rapid prototyping, and more particularly to a system, method, and process for manufacture of three-dimensional objects from computer data using computer-controlled dispensing of multiple media and selective material subtraction.

2. Description of the Related Art

As complex designs increase the need for rapid prototype fabrication, this need for immediate feedback requires model or machine shops to fabricate complex parts in low volume with minimum setup and run-time. Most fabrication methods, however, are slow, complex, and expensive.

While manual machining and forming methods are often cheap and effective for simple designs, the costs can be prohibitive for the iterations required of complex parts and assemblies. Computer Numerically Controlled (CNC) machines are widely used to automate complex fabrication, but are costly to operate, maintain, and program just for one-of-a-kind production.

The most widely known system in the field of rapid prototyping is stereolithography. This system fabricates complex parts from computer data by employing a set of computer-controlled mirrors to scan a laser beam across selected two-dimensional areas of liquid photopolymer contained in a vat and thereby form a layer of solid polymer. The cured layer, which is attached to a platform, is lowered into the vat and new layers are generated one on top of the previous layers to form a three-dimensional part.

When the part is complete, the excess resin is removed with a solvent and the platform attachment as well as all overhang supports are cut away from the desired object. Additional light exposure is required to solidify any trapped liquid.

A major drawback to stereolithography and similar approaches is that support structures must be designed to join the object to the platform and attach any overhangs, large spans or disjoint areas. The addition of these structures to the CAD model and subsequent manual removal from the part during cleaning is labor intensive and often requires special skills.

Another drawback is the additional occupational and environmental safety measures required with the use of lasers or resins. The chemicals used in this process and in cleanup require special handling, ventilation, and storage to protect the operator and the work place. High volumes of waste are generated in resin removal and cleanup. The photopolymer is expensive and nonrecyclable. All of this makes installation in common work areas or offices impractical for size and environmental reasons. Furthermore, because of the delicate nature of lasers and optics, installation and calibration is very difficult. Maintenance is expensive due to system complexity and laser costs.

Another lithographic fabrication method is selective laser sintering. This method employs a heat laser to fuse (sinter) selected areas of powdered material such as wax, plastic, or metal. In practice, a vat of powder is scanned by the laser thereby melting individual particles which then stick to adjacent particles. Layers of the fused powder are processed sequentially like photopolymer lithography. An advantage of the sintering method is that the non-heated powder serves as a support for the part as it is formed. This means that the non-heated powder can be shaken or dusted off the object.

Selective laser sintering, however, is also a complex, expensive optical system. The resolution of the final part is limited by the beam diameter, which is typically 0.01"–0.02". Furthermore, in an additional step, the powder is deposited and levelled by a rolling brush which requires other electromechanical components. Unfortunately, levelling fine powders with a rolling brush often causes nonhomogeneous packing density. Additionally, while power costs less (material & labor) than liquid photopolymer systems, preparing a 30 micron layer is difficult. An object built from this powder is of medium resolution, has a non-uniform surface and, often, a non-homogeneous structure.

Research has been conducted at the Massachusetts Institute of Technology in fabrication by three-dimensional printing. In this research, ceramic powder is deposited using a wide feeder over a vat or tray. A silica binder is then printed on selected areas of the powder to form a solid cross-section. The process is repeated to form a stack of cross-sections representing the final object.

This approach exhibits the same powder deposition problems as selective laser sintering, along with the additional difficulty in removing unbound powder from internal cavities. Furthermore, objects generated by this system are not recyclable. The MIT research is directed toward the production of ceramic molds. Metal or other materials are then injected or poured into the mold which is later broken away from the cast parts. Unfortunately, the mold's internal cavities, which define the final parts, are not easily inspected, which leads to an expensive trial and error process to acquire accurate parts.

Additional problems found with the art have been an inability to: provide for variable surface color or use more than one material media in the fabrication of the desired object; remove the media support for overhangs, large spans or disjoint areas automatically; or provide an automated system for physically reproducing three-dimensional computer designs and images. Systems currently available are expensive, the media they use cannot be recycled, and they cannot provide for automated part handling after fabrication due to their use of bulk powders and resins, which require containers rather than conveyor platforms. Accordingly, improvements which overcome any or all of these problems are presently desirable.

By way of further background, U.S. Pat. No. 4,665,492, issued May 12, 1987 to Masters, describes a computer automated process and system for fabricating a three-dimensional object. The disclosed method requires the use of an origination seed at which particles of the part-forming material are directed, and to which the particles adhere to form the object. As such, it is believed that the complexity of the shape of objects formed by the disclosed method is limited, as only those objects which can be formed in a unitary manner from the origination seed can be produced by this method.

By way of still further background, U.S. Pat. No. 4,961,154 issued Oct. 2, 1990, and European Patent Office Publication No. 0 322 257 published Jun. 6, 1989, disclose methods for producing three-dimensional parts by the selective photoexposure of photopolymers. Each of these references disclose a method and apparatus by which a layer of photopolymer is dispensed and selectively exposed to light, followed by development of the exposed layer. These references further disclose that a different support material may be substituted for the non-polymerized photopolymer in each layer by removing the non-polymerized photopolymer, and filling those portions of the layer from which the non-polymerized polymer were removed with a different support material, after which the next object layer is formed in a similar manner. The methods disclosed in these references are limited to photopolymer processing, and as such are useful to produce a part from only a narrow set of materials. In addition, the machines for producing a part according to this method are necessarily quite complex, considering that non-polymerized material must be removed and disposed of during the processing of each layer, requiring the transport of the material being processed from station to station in the machine.

SUMMARY OF THE INVENTION

In view of the above problems associated with the related art, it is an object of the present invention to provide a computer-aided manufacturing system, apparatus and a method for fabricating an object in more than one material media and/or in more than one surface color.

It is another object of the present invention to provide an automated system, apparatus and method for physically reproducing three-dimensional computer designs and images, including automated part handling after fabrication.

It is yet another object of the present invention to provide a system, apparatus and method for automatically removing the media support for overhangs, large spans, disjoint areas and the like from the fabricated object.

It is a further object of the present invention to provide a system, apparatus and method for fabrication of an object using recyclable media.

It is a further object of the present invention to provide such a system and method which utilizes an integrated head to perform each of the process steps required in a part layer in a single pass, thus simplifying the processing system required for producing a part.

It is a further object of the present invention to further improve such a method of producing a three-dimensional object, and the reliability of the system for doing so, by forming objects as filled shells from data bases specifying solid objects.

It is a further object of the present invention to further improve such a method of producing a three-dimensional object, by providing a method of dispensing and processing material only at those locations of each plane of the object being produced that are necessary to support the next object layer.

These and other objects are accomplished in the system, method, and process of the present invention. In preferred embodiments, a method and process for computer-controlled manufacturing of desired three-dimensional objects involves dispensing a layer of liquid insoluble material onto a platform at predetermined locations. This liquid media hardens once it contacts the platform. Although using a water soluble platform is preferable, the platform can be permanent without violating the spirit of the invention.

A water soluble media is then sprayed to encapsulate the hardened insoluble media. This water soluble media also hardens on contact. The uppermost surface of this encapsulant is planed, thereby removing a portion of the water soluble encapsulant to expose the underlying insoluble material for new pattern deposition. The resulting residue from such planning is removed and another layer of liquid insoluble media is dispensed onto the planed surface. These two-dimensional spray patterns are printed sequentially or "stacked" to form a three-dimensional object surrounded by a water soluble mold. This cycle of dispensing of a liquid insoluble media layer and water soluble encapsulant layer, followed by planing and removal of planing residue is known as a print cycle and continues until the three-dimensional object is completed. At this point, the object is immersed in water, thereby dissolving the water soluble mold, leaving the three-dimensional object intact.

According to another preferred embodiment a system for manufacturing three-dimensional objects from computer data comprises at least one object scanning and image capture device used to generate and store specific data about a desired three-dimensional object. This data is sent to a microprocessor control system which processes the received data into sequential cross-sections of the three-dimensional object to be physically rendered.

At least one dispensing device sprays a layer of at least one eutectic material in predetermined areas on a target surface and at least one nozzle sprays water soluble material to encapsulate the layer of eutectic material based on input from the microprocessor control system. The exact positioning of the sprayed materials is determined by not only the pattern received from the CAD system, but also by a set of linear positioning devices that move the at least one dispensing device, the at least one nozzle or the target surface according to instructions received from the microprocessor control system.

Once a layer of eutectic material is encapsulated with the water soluble material, a microprocessor-controlled cutting device planes the encapsulated material to expose the underlying eutectic material, while a microprocessor-controlled vacuum fixture removes the unwanted planed material. When all of the print cycles are finished, the completed object and mold are immersed in a support removal system employing water, thereby dissolving the water soluble mold and leaving the three-dimensional object intact.

A major advantage to the system and process of the present invention is that selected layers of liquid insoluble material, and even selected locations within a layer, can be colored differently than the remaining layers of liquid insoluble material, thereby allowing for a full range of colors and everything from subtle shading to abrupt changes of color within the same manufactured object. This aspect makes it possible for quality, detailed visualization models to be manufactured for a wide variety of uses such as scientific, medical, and geological study, to name a few. Furthermore, by using more than one type of insoluble material, varying textures can be achieved as well. Also, by judicious selection of the insoluble media, such as wax, thermoplastic, etc., and the use of water soluble media for a mold, the mold media and object itself is recyclable.

According to other embodiments of the invention, a single integrated head is provided by which the prior layer is planarized, and both the part layer and support material is dispensed, in a single pass of the head over the target surface. Such construction provides for faster and simpler production of the part or object, and a lower cost system for producing such parts and objects.

According to still another embodiment of the invention, the system includes the capability of converting a computer data base representation of a solid object into one representative of a hollow object with a user-specified shell thickness. As a result, the volume of part material required to form the part is reduced to that of the shell alone, allowing for more of each layer to be formed of support material rather than object material, such support material being dispensed in a less precise manner. The precision ink jet print head is also subject to less wear by this method, improving system reliability.

According to still another embodiment of the invention, the system includes the capability of determining, from the next and later layers to be processed, if part material will be dispensed thereover and, if not, ceasing the dispensing of support material at such locations. Furthermore, this capability provides the ability to only planarize the target surface at those locations at which the next part layer will be dispensed, reducing the amount of residue generated and the degree of processing beyond that necessary.

These and other features and advantages of the invention will be apparent to those skilled in the art from the following detailed description of a preferred embodiment, taken together with the accompanying drawings, in which:

DESCRIPTION OF THE DRAWINGS

FIG. 1a is a perspective drawing of an automated three-dimensional object manufacturing station according to a preferred embodiment of the present invention;

FIG. 1b is a perspective drawing of an example three-dimensional object manufactured according to the present invention;

FIGS. 9a and 9b are elevation and plan views, respectively, of an integrated dispensing and planarizing head according to an alternative embodiment of the invention.

FIG. 10 is an elevation view of a planarizing blade according to an alternative embodiment of the invention.

FIGS. 11a and 11b are elevation views of alternative planarizing components according to alternative embodiments of the invention.

Corresponding numerals and symbols in the different figures refer to corresponding parts unless otherwise indicated.

DETAILED DESCRIPTION OF THE PREFERRED EMBODIMENTS

Figure 2A:
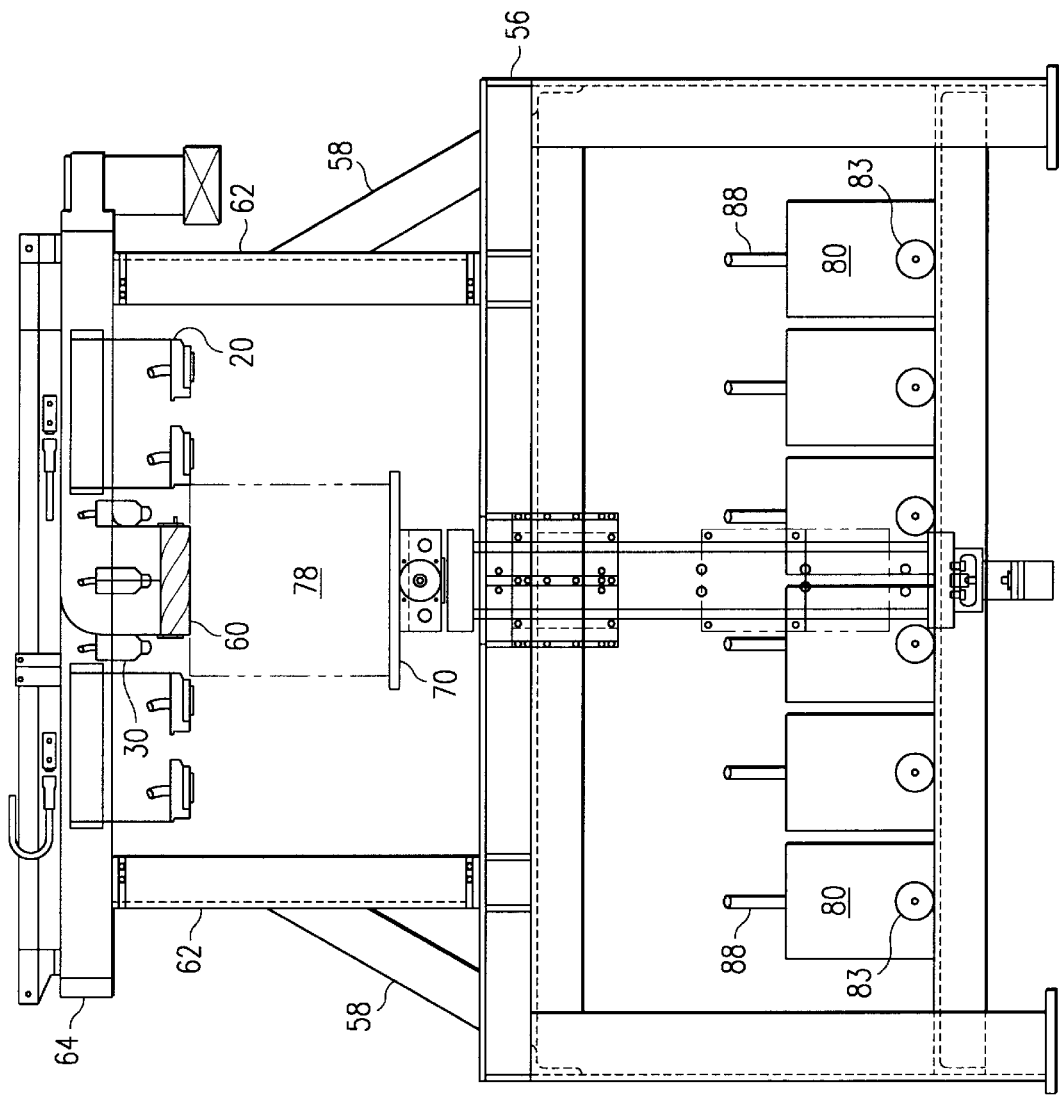
FIGS. 2a–c are front, top, and left side views of another preferred embodiment of the rapid prototyping system of FIG. 1a according to the present invention.

The present invention fabricates exact copies of a CAD model without tooling and can operate in an ordinary work environment because it is environmentally safe.

Whenever CAD images are referred to herein, it should be understood that images from other object scanning and image capture devices can also be fabricated to scale using the present invention. Without limiting the scope of the present invention, examples of such devices commonly used include computer-aided design (CAD), computer-aided manufacturing (CAM), computer-aided engineering (CAE), computer tomography (CT), magnetic resonance imaging (MRI), positronic emission tomography (PET), laser profilers, confocal scanning microscopy (CMS), IR imagers, electron microscopy, etc. In this fashion, an innumerable variety of subjects, including models of living creatures or plants, and even celestial bodies can also be objects reproduced in color with this invention.

FIG. 1a is a perspective drawing of an automated three-dimensional object manufacturing station according to a preferred embodiment of the present invention. One or more microprocessor-controlled dispensing or printing devices 10, which comprise printhead 20, pump eutectic materials in liquid state, either as droplets or narrow streams, toward a generally planar target surface such as platform 15. Platform 15 serves as a base for the first, and subsequent, printing and spraying operations. Independent, computer-addressable dispensing devices 10 are preferably inkjets, such as those on colored plotters or inkjet page printers, adapted to spray melted wax, plastic, or other material. Print devices 10 within printhead 20 are turned on or off according to a two-dimensional data map stored and relayed by a microprocessor.

"Microcomputer" in some contexts is used to mean that micro-computer requires a memory and "microprocessor" does not. As used herein these terms can also be synonymous and refer to equivalent things. The phrase "processing circuitry" comprehends ASICs (application specific integrated circuits) PAL (programmable array logic, PLAs (programmable logic arrays), decoders, memories, nonsoftware based processors, or other circuitry, or digital computers including microprocessors and microcomputers of any architecture, or combinations thereof. Words of inclusion are to be interpreted as nonexhaustive in considering the scope of the invention.

An injection mold tool (not shown) is used for fabricating platform 15 from a water soluble material. The mold tool may have pressure or vacuum ports as well as cooling/heating mechanisms to accelerate the molding process. Additionally, the mold tool cavity may be of varying cross-sectional thickness depending on the geometry of the desired object. Platforms made of metal or other non-soluble materials such as ceramics or special plastics are less desirable than water soluble platforms because they diminish the area exposed to solvent during the wash phase.

Returning to FIG. 1a, one or more materials 25 are converted by heat or other process to a liquid state, and then ejected by printhead 20 to strike platform 15 where materials 25 rapidly solidify and adhere, thereby creating a two-dimensional pattern layer of varying cross-section. Several such layers formed sequentially on top of each other are known as a stack. It should be realized that although object 55, comprising a stack of layers of materials 25, 35 deposited in accordance with microprocessor instruction, is portrayed in FIG. 1a with visible layers, this is done strictly for explanation and clarity. In practice, such layers are preferably 0.005 inch in depth and are virtually undetectable by the human eye.

Figure 2B:
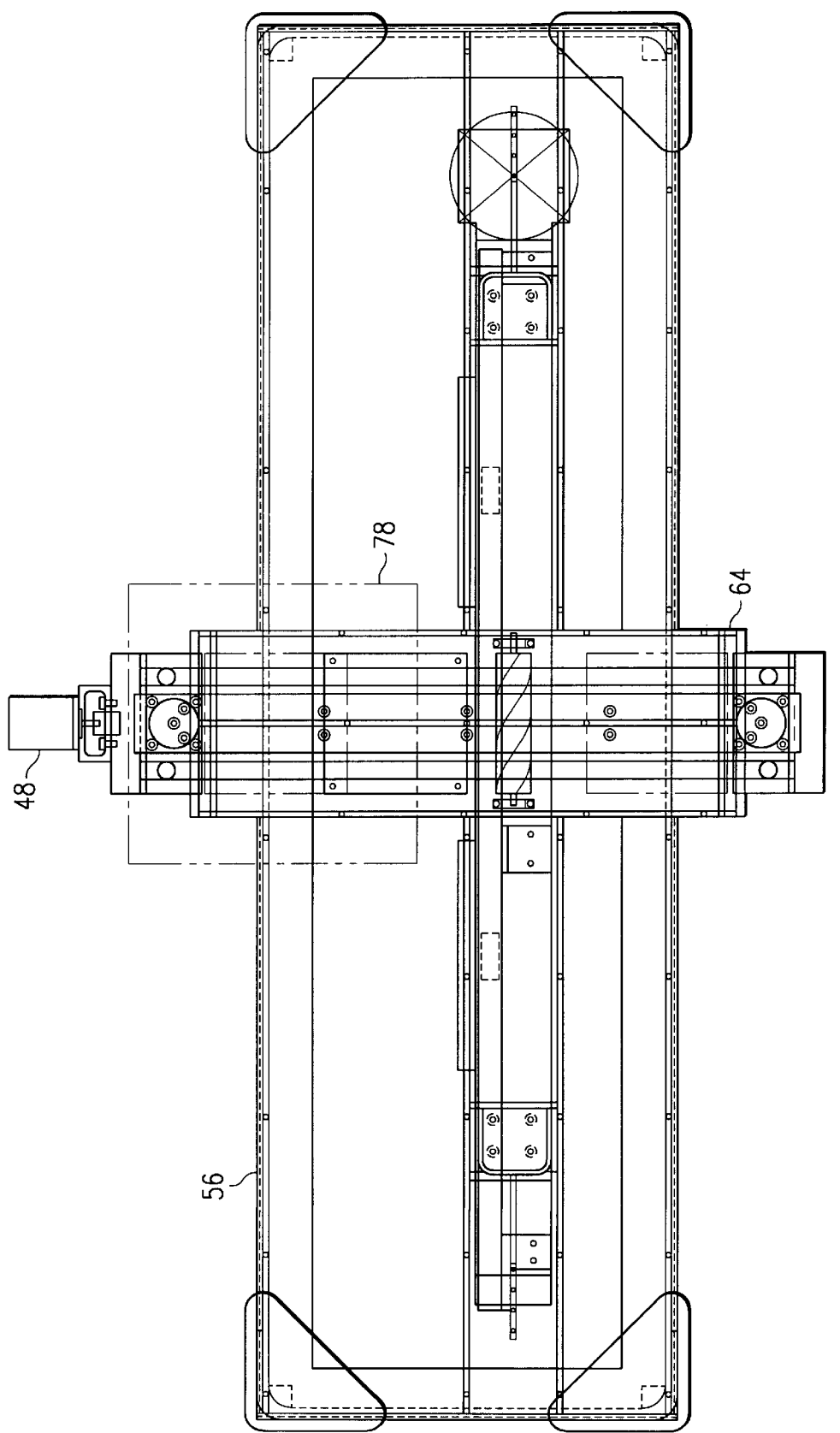
Figure 2C:
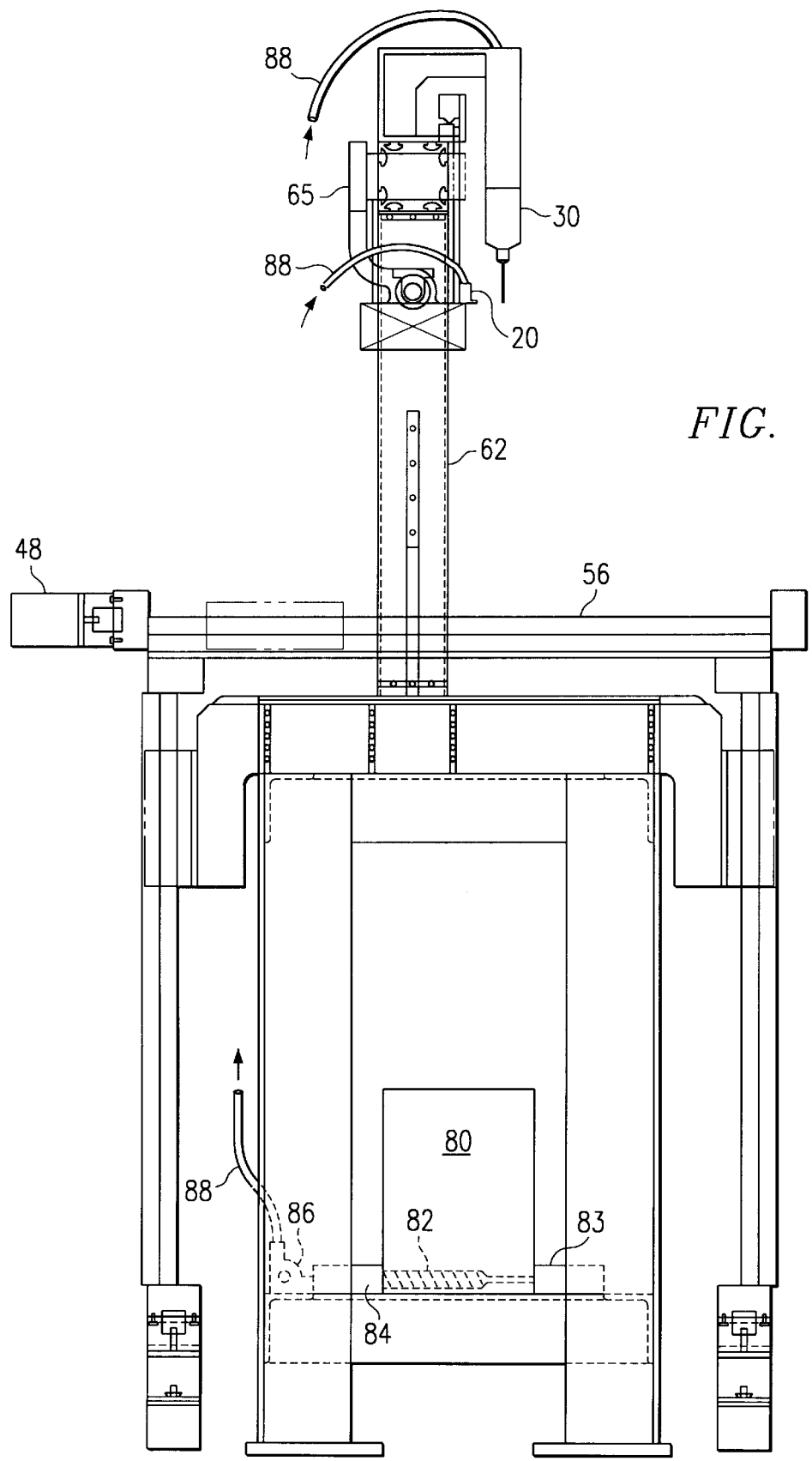

One or more heated nozzles or guns 30 (seen better in the embodiment of FIGS. 2a–c) spray a random coating, of preferably water soluble material 35, thereby encapsulating previously printed non-random, insoluble patterns. Material containment and delivery system 40, discussed in more detail in connection with FIGS. 2a–c, provides containers for each of materials 25, 35 to be deposited according to the present invention. By using heated nozzles or guns 30 for dispensing of water soluble material 35, printhead 20 life is extended because it is not utilized for any water soluble material. Additionally, a significant reduction in computer data volume and processing is realized due to the use of random spray device(s) 30, which do not require detailed instructions to direct the sprayed particles to specific x, y points.

Water soluble material 35 is preferably solid at room temperature, exhibits a melted viscosity which is compatible with common paint spray type equipment, and has good machining characteristics after deposition and hardening. Material 35 supports and encapsulates the desired insoluble three-dimensional object during fabrication. As can be seen in FIG. 1b, the water dispersion characteristics of material 35 assures a very clean three-dimensional object 55, composed of any material 25, will remain after immersion in a container of water.

A water soluble material is preferred over the support materials used with other systems discussed previously, such as powders (tend to leave a rough, flaking surface) or UV-curable resin (must be removed manually with a cutting tool or sander). Powder support methods also do not provide adequate holding force against object warpage. The use of water soluble, or at least low melting point, materials enables users of the present invention, unlike other material deposition systems, to produce complex features such as cantilevers, or suspended objects from ceilings or walls, or even something, by way of example and not of limitation, as intricate and complex as a ship in a bottle. Additionally, water soluble materials are quite inexpensive and do not necessarily need to be printed with printhead 20, but can be quickly and cheaply sprayed on with nozzles 30.

Although using a water soluble material as a mold is preferred overall, it should be understood that material 35 could be a low-melting point material which would then be removed by exposure to heat, or an alcohol-soluble material which would dissolve when immersed in alcohol. In general, dissimilar properties of the mold and object are exploited to remove the mold without affecting the object. Thus, when the final layer is printed, the support is melted or dissolved away, leaving the three-dimensional object intact, an example of which is seen in FIG. 1b. These materials, although frequently not as desirable as water soluble materials, are preferred to the support materials discussed above in connection with other material deposition systems, and use of such falls within the scope of the present invention.

Positioning devices 45, arranged along the X,Y,Z axes of a Cartesian coordinate system (and so labelled on FIG. 1a), move the printhead 20 and/or target surface 50 according to computer instructions. Target surface 50 is platform 15 for the initial deposition layer, and the previous deposition layer for any subsequent deposition layers. Specifically, positioning devices 45 can completely define any three-dimensional object, preferably by moving target surface 50 horizontally (Y) or vertically (Z), and by moving printhead 20 horizontally (X) across target surface 50. Positioning devices 45 employ circular motor 48 to move target surface 50, sprayers 30, and printhead 20. It should be noted that other motors, such as linear motors, could be used instead of circular motor 48.

It should be realized from the outset that positioning devices 45 could be a volumetric positioning device, or a planar positioning device operating together with a linear positioning device, or three linear positioning devices, etc., and such detail should in no way limit the scope of the invention.

FIGS. 2a–c are front, top, and left side views of another preferred embodiment of the rapid prototyping system of FIG. 1a according to the present invention. The description of elements shown in FIGS. 2a–c corresponding to those previously described in connection with the embodiment of FIG. 1a is hereby incorporated. As can be seen by comparing FIGS. 1a and 2a–c, the particular positioning of the elements of a system according to the present invention is immaterial, except that printhead 20 and sprayer(s) 30 are preferably positioned to dispense materials perpendicularly onto target surface 50.

The prototyping system shown in FIGS. 2a–c rests on a supporting table 56. Cantilever supports 58 strengthen supports 62 to fortify lintel support 64 from which printhead(s) 20, sprayer(s) 30, etc. hang.

One or more cutting devices 60 (best seen in FIG. 2a), arranged so as to plane the uppermost surface of target surface 50 at specified intervals along the vertical axis of fabrication, remove a portion of water soluble encapsulant 35 and expose underlying insoluble material 25 for new pattern deposition. Cutting device(s) 60 also compensates for surface and height variations caused by flow rate differences among multiple print devices 10 on printhead 20. Warpage of the object is also reduced because the planing action of cutting device(s) 60 serves to relieve stresses induced by material 25,35 cooling and shrinking.

Vacuum head and pumping system 65 (best seen in FIG. 2c) removes residue generated during the planing action of cutting device(s) 60. The residue can be recovered in a filtered canister (not shown) for disposal or further recycling. Vacuum fixture 70 (best viewed in FIG. 2a) holds building platform 15 to positioning devices 45 and permits simple, rapid removal and replacement of platform 15 without risk of damage or deformation to platform 15. Vacuum fixture 70 further enables a system according to the present invention to provide an optional automated object-in, object-out conveyor or rack 75 (shown in FIG. 1a).

Work volume 78, outlined in dashed lines in FIG. 2a, indicates the maximum object envelope in which an object may be situated as it is being printed. Because some material combinations require printing at ambient temperatures above room temperature (as with metals) or well below (as with water), an environmentally-controlled chamber can be positioned within work volume 78.

Bulk containers 80 (best seen in FIG. 2c), part of material containment and delivery system 40 of FIG. 1a, store dry, solid volumes of process material 25,35 which are then conveyed and metered by feed device 82 into corresponding smaller, heated chambers 84 where melting and filtering occurs. Feed device 82 might be of an auger or screw feed device, although other feed devices are possible, and is driven by motor 83. The ensuing melted liquid media is pressurized by pressure devices 86, each of which could be a pump or the like, prior to delivery via liquid media feed lines 88 to printhead 20 or spray gun 30. Liquid media feed lines 88 are shown are shown with a break; this is for clarity, as each of lines 88 continue from pressure devices 86 to either printhead 20 or sprayer(s) 30, depending upon the line. It may be preferable, particularly where the distance between chambers 84 and printhead 20 or spray gun 30 is relatively long, to heat media feed lines 88 in order to ensure that the medium remains in its liquid phase prior to reaching printhead 20 or spray gun 30, as the case may be.

Thus, in addition to shape-rendering, a system according to the present invention uniquely enables an object to be fabricated with high resolution color features. Beneficiaries of this unique aspect include the medical, geological, architectural, and engineering fields, as well as the arts, astronomy, and many other disciplines. Material(s) 25 may be of different material colors or color combinations, a well as different material composition. To achieve any desired level of visual realism, the colors cyan, magenta, yellow, black, and white are preferred since any intermediate hue of the full color spectrum can be obtained by material overlap or dithering.

Figure 3:
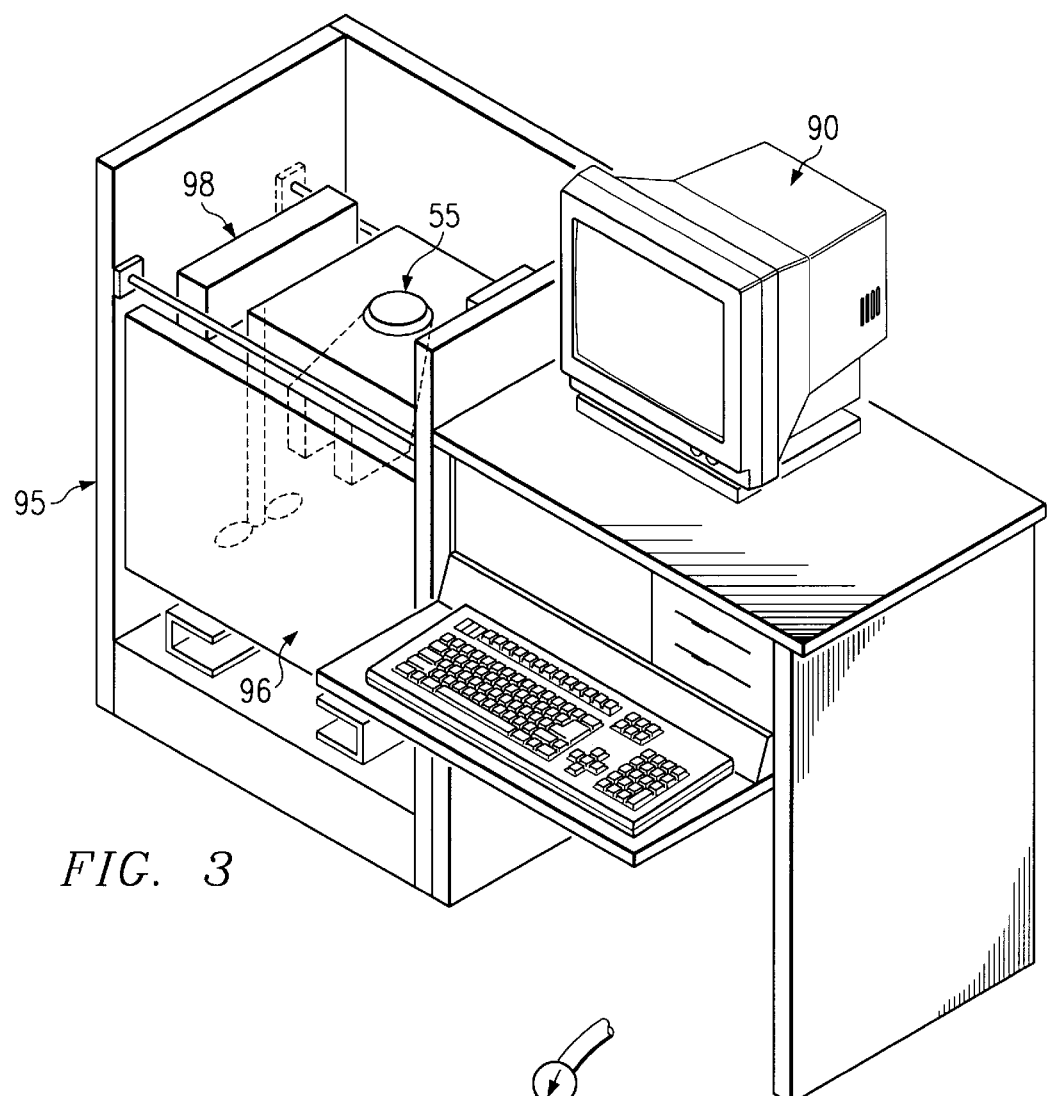
FIG. 3 is a perspective view of a microprocessor and water rinse vat according to a preferred embodiment of the present invention.

FIG. 3 is a perspective view of a microprocessor and a support removal system according to a preferred embodiment of the present invention. Microprocessor control system 90 and support removal system 95 are shown at a work station. Although not shown, such control and support removal systems could be arranged differently and could be physically combined with the systems depicted in FIGS. 1a or 2a–c to provide a fully-automated rapid prototyping system.

A CAD system is used to generate and store specific data, including dimensions, color, or other desired properties, which simulate desired three-dimensional physical objects. This data is sent to, stored, and processed by microprocessor control system 90. Microprocessor control system 90 contains, microprocessor instructions, as well as image processing and data conversion code to process the input data into sequential cross-sections of the three-dimensional object to be physically rendered.

The system, method, and process for computer-controlled manufacturing of desired three-dimensional objects involves dispensing layers of liquid materials 25, 35 onto target surface 50 at predetermined locations. These predetermined locations are established by microprocessor control system 90 based on the processed slice data received from a computer image file in the CAD system. Microprocessor control system 90 also controls the sequence and timing of the system, method, and process operations as well as the electro-mechanical components for material conveyance, feedback sensors, and system processes.

It should be realized the microprocessor control system 90 could also encompass the CAD system, or any other desired object scanning and image capture device, rather than having this function performed by separate systems.

Support removal system 95 consists of rinse vat 96 of sufficient size to fully contain a volume of solvent and object 55 on which the solvent will act. Circulation pump or stirrer 98 may be integrated to accelerate the dissolving process and carry away residue. The solvent is water when the mold material 35 to be removed is water soluble, etc.

Support removal system 95 could instead comprise temperature chamber 96 into which object 55 is placed. Air circulator 98 may be integrated in such chamber 96 to accelerate the dissolving process. This latter system could be best employed when mold material 35 melts at a lower temperature than object material 25. This allows selective removal of the mold when exposed to a temperature greater than the melting point of the mold and less than the melding point of the object. A wide range of material 25,35 combinations are possible such as water and wax, wax and plastic, plastic and metal, and so on. In the alternative, object material 25 may be a photopolymer which is dispensed at selected locations of the target surface and which is immediately cured upon dispensation, such as by way of a flood UV light or a fiber optic directed at the dispensing location. In the case where object material 25 is a cured photopolymer, a wax having a solubility different than that of cured photopolymer may be used as support material 35. In many cases mold and object materials 25,35 can be recycled for repeated use, thereby reducing waste.

Figure 4:
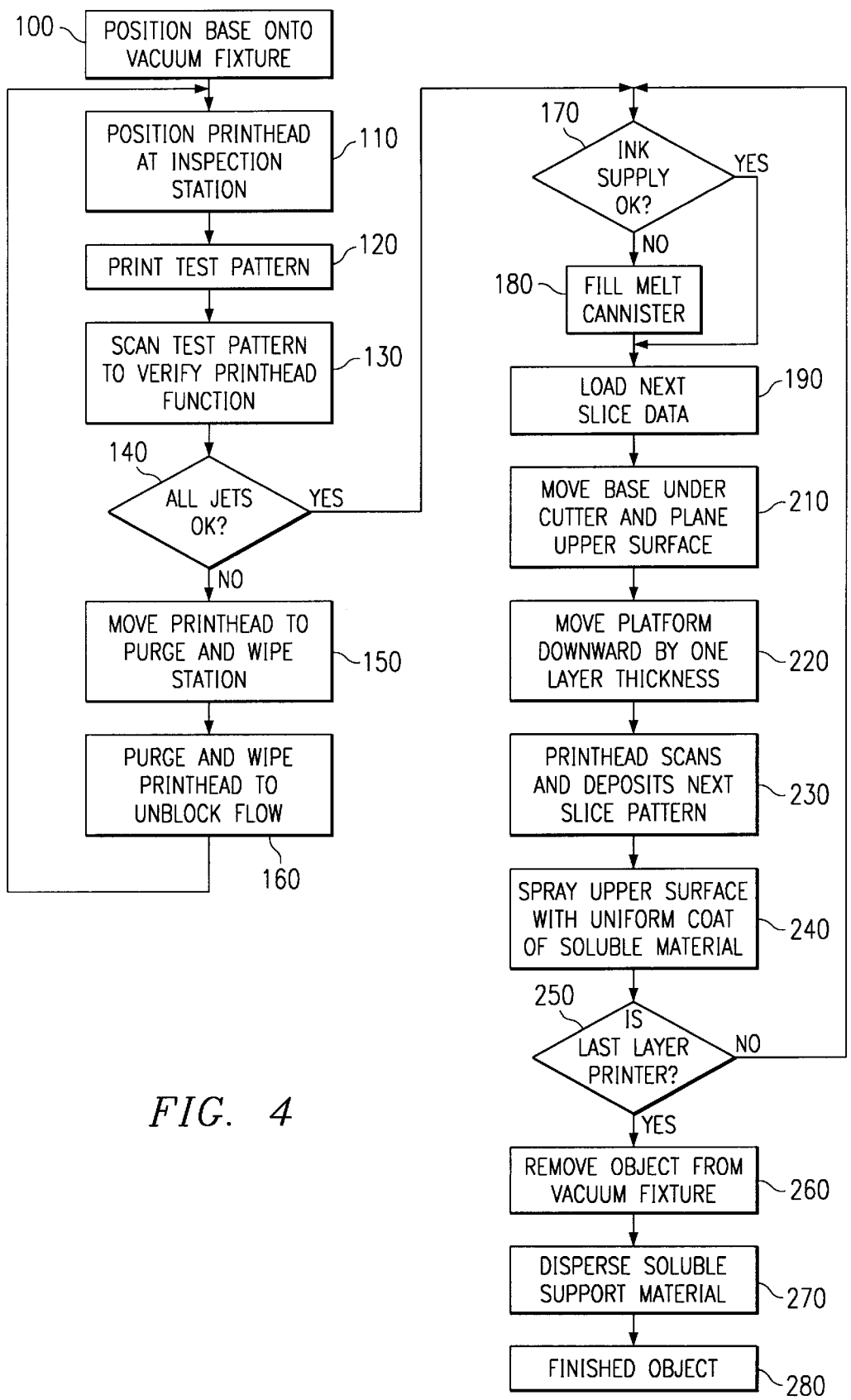
FIG. 4 is a process flow diagram depicting a process of manufacturing a three-dimensional object according to a preferred embodiment of the present invention.

FIG. 4 is a process flow diagram depicting a process of manufacturing a three-dimensional object according to a preferred embodiment of the present invention. Once the platform for the object is positioned onto the vacuum fixture (Block 100), the printhead jets are checked to see if they are all functioning. This is accomplished by positioning printhead 20 so its output is viewable to the optical inspection station (Block 110). The printhead jets then print a pattern of short line segments (Block 120) which are scanned to verify whether each of the jets are functioning properly (Block 130). If all of the jets are determined to not be operating properly, printhead 20 is moved to the purge and wipe station (Block 150) where the system is purged to unblock the flow of the jets (Block 160). Printhead 20 is then returned to the optical inspection station (Block 110), where the jets are again checked (Blocks 120 and 130). Although it is not shown in the process of FIG. 4, it should be apparent that printhead 20 could be checked as often as desired.

If all of the jets are operating properly (Block 140), the ink supply is checked (Block 170). If the supply is found to be inadequate, the melt canister is filled from the bulk canister (Block 180). Once the ink supply is sufficient, the process continues by loading the object's slice data (Block 190).

The object's slice data is generated from a three-dimensional computer "object" image including color information is converted by application software to a vertical sequence of two-dimensional patterns. Although a second image could be software generated in the form of a negative volume around the first image, the "mold" image converted to a set of two-dimensional slices and the slice data of the object and mold then combined in sequential order, a second image is not necessary or preferred. The global action of sprayers 30 allow for accurate printing with only the object's image.

Once the first slice data is loaded (Block 190), platform 15 is positioned so cutting device(s) 60 can plan its upper surface (Block 210) and platform 15 is lowered by one layer's thickness (Block 220). Printhead 20 then scans and deposits the slice pattern according to the slice data received (Block 230). The first layer's slice data determines print head position above platform 15 along with appropriate ejector function at that location. Printhead 20 moves in a plane parallel to platform 15 until the layer is complete. Once the printing of the first slice's pattern is completed, sprayers 30 spray the upper surface of target surface 50 with a uniform layer of soluble support material 35 (Block 240).

Although loading the next slice data is shown in the process flowchart before the planing step, it can occur after the planing step or preferably, simultaneously with the planing step. In fact, microprocessor control system 90 may load the next slice data at any time during the print cycle when most expeditious.

If this is not the last layer to be printed (Block 250), the ink supply is again checked (Block 170) and ink added if needed (Block 180). The next slice data is loaded (Block 190) while platform 15 is positioned so cutting device(s) 60 can plane the upper surface of target surface 50 (Block 210). Platform 15 is then moved downward by one layer thickness (Block 220) and the next layer printed (Blocks 230,240). If this is the last layer to be printed (Block 250), the part is removed from the vacuum fixture (Block 260) and immersed in a solvent, preferably water, to dissolve the soluble support material (Block 270). This process yields the completed three-dimensional object (Block 280).

In an example of preferred process according to the present invention, liquid wax at 140 degF (material 25) is jet-printed in sequential layers to form the object pattern. Simultaneously, sequential layers of ice (material 35) are jet-printed around the object pattern to form a frozen mold. The combined solid mass of materials 25, 35 is then heated to melt the mold portion only, leaving a high resolution, recyclable casting pattern. Many other materials 25,35 combinations are possible, limited only by the imagination of those skilled in the art.

Figure 5:
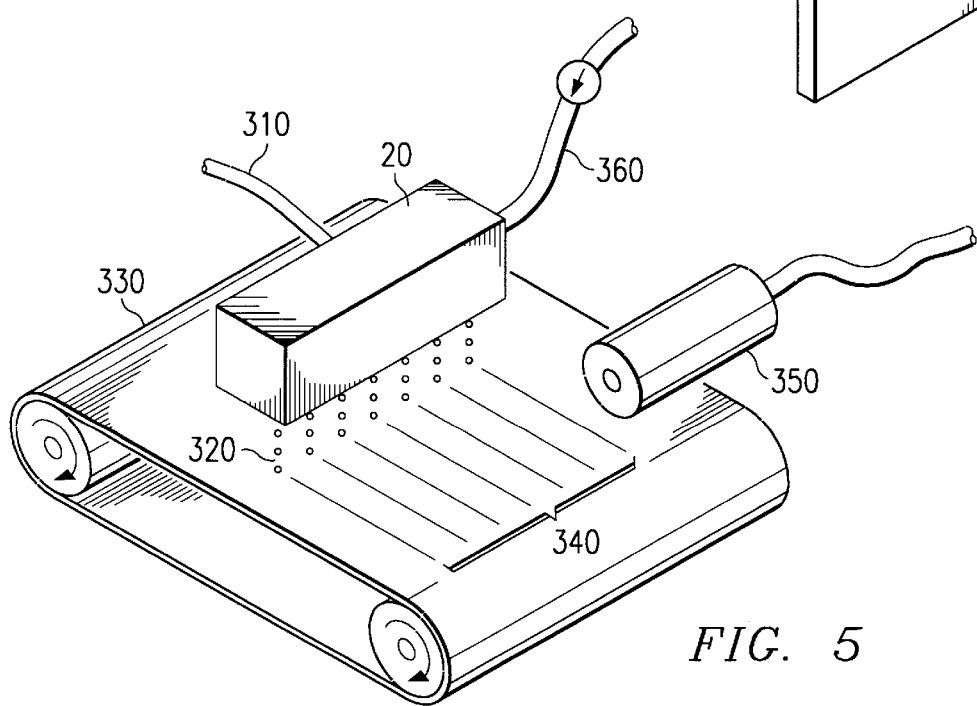
FIG. 5 is a perspective view of a printhead inspection and purging station according to a preferred embodiment of the present invention.

FIG. 5 depicts a printhead inspection and purging station according to a preferred embodiment of the present invention. Printhead 20 receives melted media via media feeder tube 310 and deposits drops 320 of such media onto conveyor belt 330 in the form of short parallel lines 340. The surface of conveyor belt 330 is preferably made of paper. Optical sensor 350 scans parallel lines 340 printed by simultaneous operation of all printing devices of jets 10 (not visible from the drawing) of printhead 20. The microprocessor responds to any output of optical sensor 350 indicating at least one malfunctioning print device by directing printhead 20 away from conveyor belt 330 to complete a purge-and-wipe for expulsion of any foreign matter. Air is forced into printhead 20 via purge valve-monitored air tube 360. This effectively purges the foreign matter from any malfunctioning print device 10 on printhead 20. Printhead 20 is then wiped off (not shown) and repositioned over conveyor belt 330. Printhead 20 again deposits fresh media drops 320 onto conveyor belt 330 in the form of short parallel lines 340 which are scanned by optical sensor 350. This procedure repeats until all print devices 10 on printhead 20 are properly functioning. Although an inspection system employing an optical sensor is discussed as preferable, various other inspection systems will occur to those skilled in the art.

Figure 6A:
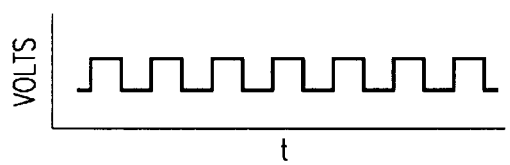
FIGS. 6a–b are waveform diagrams reflecting detector output according to a preferred embodiment of the present invention.
Figure 6B:
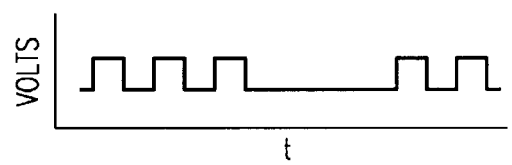

FIGS. 6a–b depict waveform diagrams reflecting the output of optical sensor 350 according to a preferred embodiment of the present invention. In these diagrams, square waveforms accurately show the number of jets functioning. The lack of a square waveform where there should be one indicates a malfunctioning jet. FIG. 6a details the output from optical sensor 350 with all of the jets functioning, while FIG. 6b shows a waveform consonant with two jets malfunctioning.

Figure 7A:
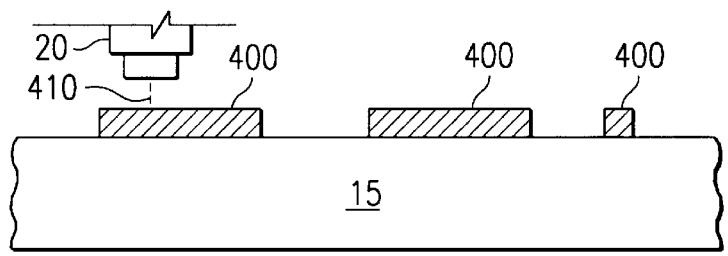
FIGS. 7a–c depict views of the resulting structure during selected process steps for manufacture of a three-dimensional object made of a low melting point material according to the preferred embodiment of the present invention of FIG. 4.
Figure 7B:
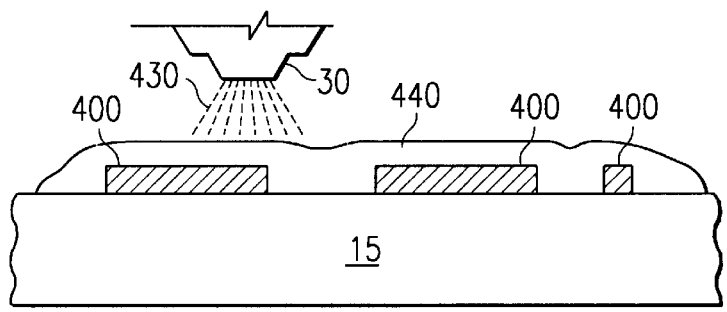
Figure 7C:
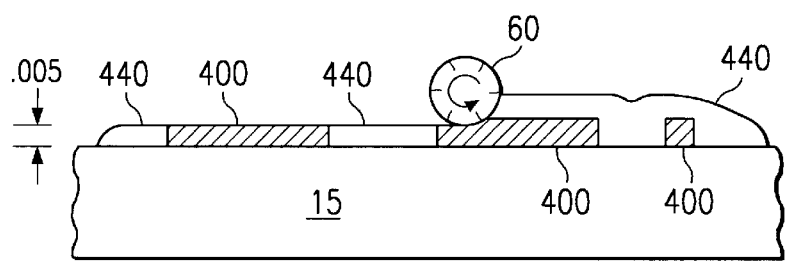

FIGS. 7a–c depict views of the resulting structure during process steps 230, 240, and 210, respectively, for manufacture of a three-dimensional object to be made of a low melting point material such as wax, according to the preferred embodiment of the present invention of FIG. 4. FIG. 7a shows printhead 20 depositing drops 410 of wax to form a wax layer 400 at specific locations on soluble platform 15 as determined by the micro-processor control system according to the CAD image. Such layer 400, regardless of composition, is known as the positive material and, when all layers are completed, will form the desired three-dimensional object.

In FIG. 7b sprayer 30 sprays droplets 430 of water soluble mold material 440 to encapsulate deposited wax layer 400 residing on soluble platform 155. Material 440, regardless of composition is known as the negative materials and, when all layers are completed, will form the mold. A unique feature of FIG. 4's process is seen in FIG. 7b, namely that the sprayed negative material 440 is random, such that spray particles are not directed by computer to specific x,y points.

To prepare the surface for subsequent layers, a mill cutter or other cutting device(s) 60 removes some of the previous layer thickness to expose the positive material 400. FIG. 7c depicts cutter 60 planing water soluble mold material 440 to expose deposited was layer 400. This step also defines the thickness of each layer and compensates for different inkjet dispensations. After all layers are processed, negative material 440 is selectively removed by solvent, not shown, leaving positive material 400, wax in this case, intact.

Certain materials may be too viscous to be used in inkjet type mechanisms. These materials may, however, exhibit desirable properties such as durability, appearance, or solubility in water. A desired use for such viscous material, intended only as an example and not by way of limitation, might include circuit assemblies manufactured from conductive media such as pastes and epoxies.

To utilize high melting point or high viscosity materials, atomizing nozzles and pressurized guns, such as those used for painting, can be used as an alternative to inkjet type print-heads. Such nozzles or guns can employ pressurized syringes or piston-type action, and are available with various nozzle diameters.

Figure 8A:
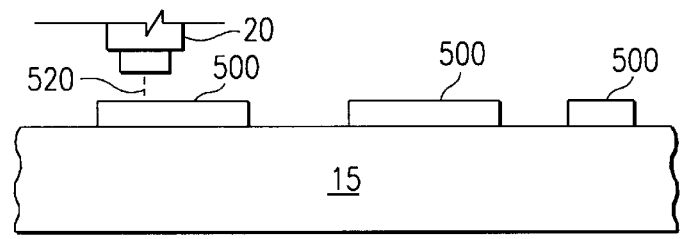
FIGS. 8a–c depict views of the resulting structure during selected process steps for manufacture of a three-dimensional object made of a high melting point or high viscosity material according to a preferred embodiment of the present invention of FIG. 4.
Figure 8B:
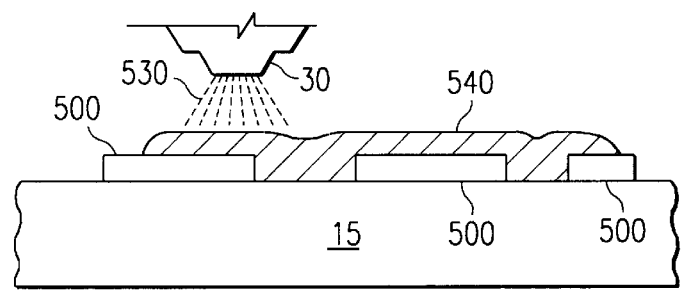
Figure 8C:
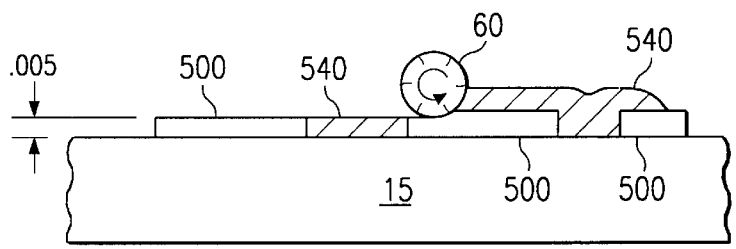

FIGS. 8a–c depict views of the resulting structure during process steps 230, 240, and 210, respectively for manufacture of a three-dimensional object to be made of a high melting point or high viscosity material, according to the preferred embodiment of the present invention of FIG. 4. It is understood that such high melting point or high viscosity material can be metal, ceramic, plastic, paste, epoxy, etc., as well as a combination or alloy of such materials, such as tin-lead alloy as an example and not by way of limitation.

FIG. 8a shows inkjet printhead 20 depositing drops 520 of wax to form a wax layer 500 at specific locations on platform 15 as determined by the microprocessor control system according to the CAD image. Such layer 500, regardless of composition, is the negative material and, when all layers are completed, will form the mold or support.

In FIG. 8b sprayer nozzle or gun 30 sprays droplets 530 of high melting point or high viscosity material 540 over the support material 500 and any pattern cavities therein. Material 540, regardless of composition is the positive material and, when completed, will form the desired three-dimensional object. A unique feature of FIG. 4's process is seen in FIG. 8b, namely that the sprayed positive material 540 is random, such that spray particles are not directed by computer to specific x,y points.

To prepare the surface of subsequent layers, a mill cutter or other device removes some of the previous layer thickness to expose the positive material. FIG. 8c depicts cutter 60 planing positive material 540 to expose deposited wax layer 500. Each layer is milled to a prescribed thickness which compensates for different nozzle dispensations. After all layers are processed, the final volume consists of a high melt-point or high viscosity object with a low melt-point mold. The negative material 500 is selectively removed by solvent or heat, not shown, leaving the high melting point or high viscosity positive material 540 intact.

This approach is unique in that it enables objects to be made of many more materials, such as nylon, PVC, or even metal alloys to name a few, which could not be possible using inkjet printer mechanisms alone. Furthermore, milling the upper surface of deposited layers serves to relieve stress which, for other systems, causes part warpage. Also, the number of inkjet printheads required is reduced, since much of the material is sprayed randomly while providing sufficient broad area coverage.

Referring now to FIGS. 9a and 9b, the construction and operation of integrated printhead 600 according to an alternative embodiment of the invention will now be described in detail. Integrated printhead 600 includes the necessary apparatus for fully producing a layer of object 55, including the dispensing of object material 25 and support material 35, and the planarizing of the surface for each layer, in a single pass over the target surface. This single pass processing greatly speeds up the fabrication process, and also reduces the complexity and cost of the system for producing three-dimensional objects according to the present invention.

Integrated printhead 600 includes mounting plate 604 to which each of the components are mounted in a spaced apart relationship thereto. Printhead 20 is mounted to plate 604, and is for dispensing object material 25 from adjacent storage reservoir 620 responsive to signals provided on wires 602 connected thereto. As illustrated in FIG. 9b, nozzles 603 are staggered in a diagonal fashion in the well-known manner for inkjet printheads. Located behind printhead 20 (in the y-direction) and off to one side therefrom (in the x-direction) is dispenser 30 for dispensing support material 35 from adjacent reservoir 630. For example, dispenser 30 may be on the order of 0.1 inches (or greater) behind printhead 20 in each of the x and y directions. Considering that integrated printhead 600 will be traveling in the +y direction (as indicated by the axis reference in FIGS. 9a and 9b), dispenser 30 will lag behind printhead 20 in the formation of the three-dimensional object. In operation, dispenser 30 may be dispensing support material 35 at a lagging location at the same time at which printhead 20 is dispensing object material 25 in advance of dispenser 30. As a result, a layer of a molded object may be rapidly formed, without requiring multiple passes of the individual printhead 20 and dispenser 30. In addition, the complexity of the system is also much reduced, especially over the known systems described in the above-cited U.S. Pat. No. 4,961,154 and European Patent Office Publication No. 0 322 257, each requiring transporting the object among multiple process stations in order to process a single layer.

Optionally, a heating element or duct for providing heated gas (not shown) may be mounted to mounting plate 604 to locally heat the portion of target surface at which printhead 20 is to dispense object material 25, particularly those locations at which object material 25 is to be dispensed upon object material 25 in the prior layer. Such local heating, whether effected by way of conduction, convection or radiation, preferably raises the upper portion of object material to a sufficient temperature so that it is in a softened state, improving the adhesion of object material 25 dispensed in the current layer to object material 25 in the prior layer. Furthermore, this local heating allows the thermal contraction of object material 25 in the prior layer to match that of object material 25 in the newly dispensed layer.

Integrated printhead 600 further includes knife 608 for planarizing the target surface in advance of printhead 20 as integrated printhead 600 travels in the y direction. In the single pass processing enabled by integrated printhead 600, it is preferable to planarize the target surface directly in advance of dispensing object material 25 and support material 35, rather than behind dispenser 30 and the dispensing of support material 35. By planarizing in advance of printhead 20, object material 25 and support material 35 have had a longer period of time in which to solidify prior to planarizing than would be the case if knife 608 were located directly after dispenser 30. The planarization of the more completely hardened material results in a more planar target surface, and precludes the smearing of support material 35 between successive layers of object material 25.

Surrounding knife 608 is vacuum pickup hood 610 for removing the residue from the planarizing action of knife 608 on the target surface; knife 608 is mounted within vacuum hood 610 by way of mounting plate 606. Vacuum pickup hood 610 exhausts residue via duct 612 to a recovery location away from the processing area. In the alternative to vacuum pickup hood 610, a brush or air jet may be provided to displace the residue from the target surface. Brush shield 614, formed of bristles or other suitable construction, may optionally be provided as shown in FIG. 9a to prevent any residue not picked up by vacuum hood 610 from affecting the selected locations at which printhead 20 dispenses object material 25, and to protect the process mechanism at the selected dispensing locations from other contaminants.

As illustrated in FIG. 9a, knife 608 has a stepped cutting edge, rather than a single cutting edge. It is believed that the likelihood of chipping out a material when shaving its top surface increases according to the ratio between the thickness being shaved to the total thickness of the layer. Accordingly, a single cutting blade of a single depth is believed to be quite likely to chip out the surface, especially if the variation in surface topography (peak-to-valley) is on the order of 30%, as is expected in this method. According to this embodiment of the invention, the stepped cutting blades of knife 608, each having a depth of on the order of 0.001 inches, provide multiple shallow shaving steps in succession. A flat region is provided at the very bottom surface of the deepest blade to further smooth the target surface. As a result, knife 608 greatly reduces the likelihood of chipping out the target surface, as the thickness of material removed by each incremental cutting surface, relative to the layer thickness, is reduced.

Referring to FIG. 10, knife 608' according to an alternative construction is illustrated. Knife 608' includes a single sloped blade with a trailing flat surface (when viewed in cross-section) rather than multiple steps. As a result of this construction, each incremental motion of blade 608' in the y direction will cause the removal of an incremental amount of target surface, also avoiding chipout of the target surface.

Also according to an alternative embodiment of the invention, mounting plate 606', to which knife 608' is mounted, is movable under the control of solenoid 606 responsive to signals on wires 618. This construction allows for selective control of knife 608' (or, alternatively, knife 608 with multiple shallow steps), so that the planarization is only performed at selected locations. For example, at those locations of the target surface at which support material 35 is to be next dispensed, no planarization is necessary due to the non-critical nature of the shape of the support material 35 in the object (as it will be removed anyway). In contrast, the locations of the target surface at which object material 25 is to be dispensed must be planarized to ensure that object material 25 adheres to that of the prior layer, and to provide proper dimensional control in the formation of the object. Movable knife 608' can be controlled by way of solenoid 606 so that it contacts the target surface only at those locations at which object material 25 is to be next dispensed; as a result, the amount of shaving and planarizing residue generated is much reduced, as is the wear on blade 608'.

Referring now to FIG. 11a, integrated printhead 600' according to an alternative construction, and utilizing an alternative technique for planarization, is illustrated. According to this example, roller 640 trails printhead 20 and dispenser 30 in integrated printhead 600', and smooths the surface of the dispensed layer after dispensation of support material 35. It is contemplated that cold rolling will suffice to smooth support material 35 in many cases. Alternatively, roller 640 may be heated to ensure proper smoothing of support material 35; in such a case, it may be preferred to provide a non-stick coating, such as TEFLON coating, on roller 640. In addition, to promote adhesion of the next layer of object material 25 to the prior layer, roller 640 may be provided with a knurled or otherwise rough surface to leave a rough impression on the dispensed layer.

Referring now to FIG. 11b, integrated printhead 600" according to still another alternative construction is illustrated in an elevation view. Integrated printhead 600" includes thermal bar 642 which trails dispenser 30 at a height above the target surface. Thermal bar 642 is energized to be heated, for example by wires 644 in the example of a resistive element type, to reflow support material 35 and object material 25, resulting in a smooth target surface for the next layer.

Either of roller 640 or thermal bar 642 may be installed in advance of printhead 20 rather than trailing as shown in FIGS. 10a and 10b, depending upon the characteristics of the materials being used.

Further in the alternative, it is contemplated that object material 25 and support material 35 may be dispensed in a layer in such a manner as to have substantially a planar top surface, without requiring additional planarizing and machining to form a planar target surface for the next layer. This may be accomplished, for example, by way of an inkjet printhead similar to printhead 20, such that the dispensed volume of support material 35 is carefully controlled. In this case, integrated printheads 600, 600', 600" described above would not include knife 608, roller 640, thermal bar 642, or other means for planarizing the target surface. Alternatively, by measuring the volume of support material 35 dispensed in real time, the system can control the volume of support material 35 dispensed by dispenser 30 so as to match the thickness of the object material 25 dispensed by printhead 20; printhead 20 may also be controlled so that the volume of object material 25 it dispenses may be similarly adjusted in real time. This measurement and control can additionally ensure coplanarity of both object material 25 and support material 35 across the entire surface of the layer. Examples of real-time measurement techniques contemplated to be useful in this method include optical measurement such as an interferometer, mechanical measurement such as a follower brush, and other known film thickness measurement techniques.

Figure 12:
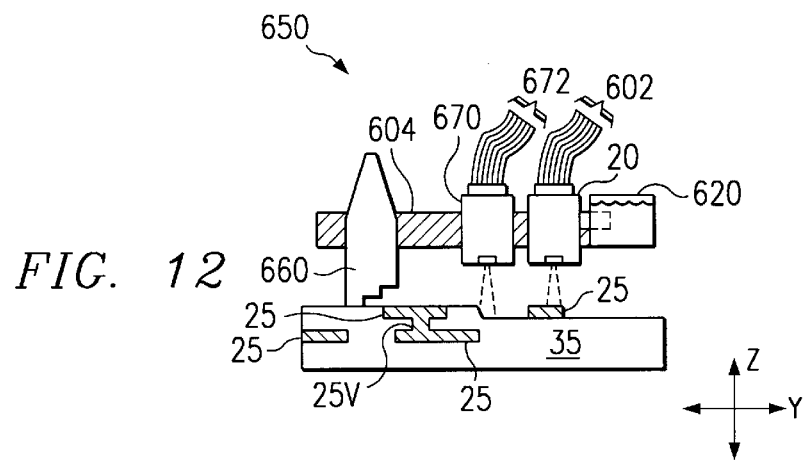
FIG. 12 is an elevation view of an integrated dispensing and planarizing head for producing a multilayer printed circuit board according to an alternative embodiment of the invention.

Referring now to FIG. 12, an application of the present invention in producing a multilayer printed circuit board is illustrated in cross-section. In this example, object material 25 comprises a conductive material such as aluminum, and support material 35 comprises a dielectric material such as polycarbonate plastic, a polymer resin, or other well known electrically insulative materials. According to this embodiment of the invention, support material 35 is not removed upon completion of the formation of the object (which is a printed circuit board), but instead remains as a unitary portion of the object formed. Optionally, during its manufacture, selected locations of the circuit board may receive soluble support material 35 to be removed after formation of the object in the manner described above, instead of support material 35 which is to remain in place, thus enabling the fabrication of printed circuit boards of complex shape.

As illustrated in FIG. 12, integrated printhead 650 includes printhead 20 for dispensing conductive object material 25, and printhead 670 for dispensing insulative support material 35. In contrast to dispenser 30 of printhead 600 described hereinabove, printhead 670 preferably dispenses support material 35 with a relatively high degree of precision. Construction of the printed circuit board proceeds in similar manner as described hereinabove, including the planarization of each layer's top surface by knife 660 (which trails printheads 20, 670 in this embodiment of the invention).

In operation, the printed circuit board is constructed by printhead 20 dispensing conductive object material 25 at those locations at which printed conductor lines are to be located in each layer. In the same single pass, printhead 670 dispenses insulative support material 35 as required to fill the remainder of the layer. Layers of the printed circuit board between those with conductive lines receive, in this example, conductive object material 25 at those locations where a vertical via 25V is to be placed, connecting conductive lines of different layers; the remainder of the layer containing conductive via 25V receives support material 35.

As a result, the present invention allows for the formation of a printed circuit board in a layerwise fashion, but without requiring post-processing steps of forming holes through the board and filling the holes with solder, as is required in conventional printed circuit board manufacture. Furthermore, the present invention enables the production of circuit boards with significantly more complex shapes than available in conventional circuit boards. For example, the present invention enables the formation of a unitary circuit board having locations with different thicknesses and numbers of conductive layers. In addition, it is contemplated that the present invention enables the formation of a circuit board with walls, including walls that contain conductive shielding for radio frequency interference (RFI). The increased flexibility provided by the present invention enables the formation of RFI shielding of differing thickness at different locations of the printed circuit board (and walls), depending upon the circuitry to be installed on the board.

Figure 13:
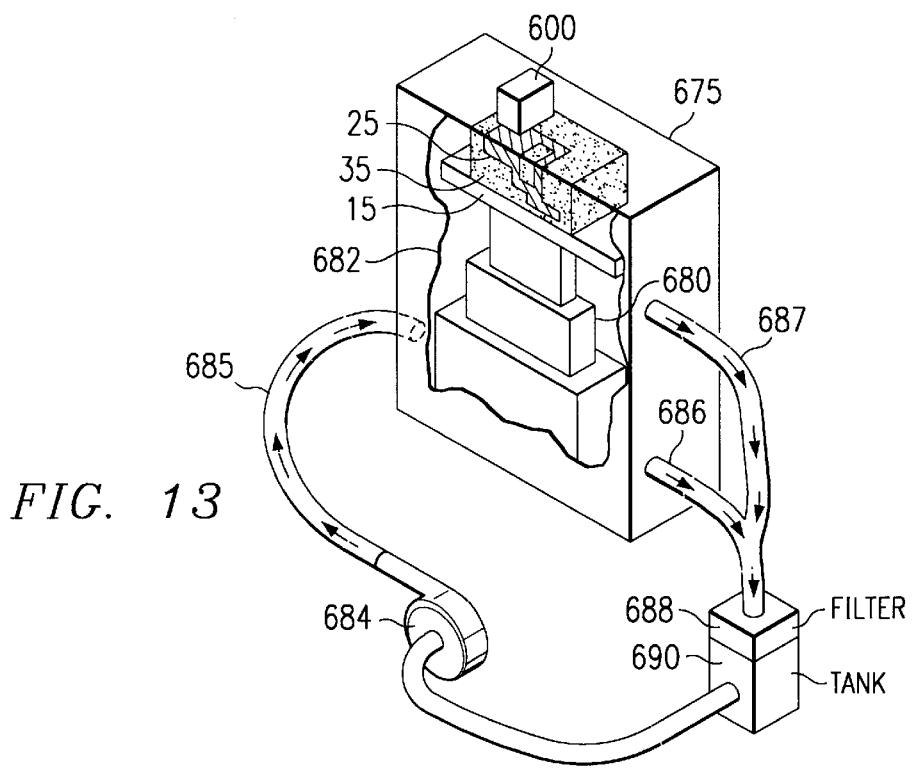
FIG. 13 is a perspective cross-sectional view of a system for producing a part according to an alternative embodiment of the invention, in which the rinse tank is integrated with the object producing workstation.

Referring now to FIG. 13, a system constructed according to yet another embodiment of the present invention will now be described. As is evident from the foregoing description, the present invention is capable of building objects of quite large size, for example on the order of one foot on a side. The weight of an object so formed, in combination with the support material, can be quite significant, such as on the order of 50 pounds. It is therefore contemplated that it would be useful to provide a system for removing support material 35 from object 55 in-situ with the fabrication method, to reduce the effort required to transport the molded object to a rinse station.

FIG. 13 illustrates an example of a system for producing an object according to the present invention, in which a wash tank is integrated therewith. Cabinet 675 has integrated printhead 600 (or such other printheads as desired) near its top surface, for forming an object of object material 25 embedded in support material 35 and overlying platform 15, as described hereinabove. In this embodiment of the invention, platform 15 is mounted at the top of telescoping actuator 680, which is controlled by a conventional motor (not shown) so as to be able to lower platform 15 into the interior of cabinet 675. Bellows 682 preferably surrounds actuator 680 to protect it from solvents to be introduced into cabinet 675, as will be described hereinbelow. Cabinet 675 receives inlet hose 685 via which solvent fluid is communicated thereto by pump 684, and presents outlet hoses 686, 687 to filter 688 so that dissolved support material 35 is screened from the fluid received from cabinet 675, prior to its storage in tank 690 for re-introduction by pump 684 into cabinet 675.

In operation, upon completion of an object, actuator 680 lowers platform 15 into the interior of cabinet 675. Pump 684 is then energized so that solvent fluid, such as water or other appropriate solvent used to selectively dissolve support material 35 relative to object material 25, is pumped into the interior of cabinet 675 via inlet hose 685, and recirculated therethrough via outlet hoses 686, 687, filter 689 and tank 690. This solvent dissolves support material 35 to yield object 55 formed of object material 25, after which actuator 680 raises platform 15 to the top surface of cabinet 675, allowing the operator to retrieve object 55 therefrom without the added weight of support material 35.

In addition, residue produced during the planarizing of a layer by knife 608 described hereinabove may be simply be swept by integrated printhead 600 off of the edge of the target surface into the interior of cabinet 675, to dissolve the planed support material 35 along with that surrounding object material 25.

The present invention as described hereinabove is thus very effective in rapidly producing three-dimensional objects of complex shape, directly from a CAD data base. It has been discovered, however, that the efficiency in producing such objects can be still further enhanced, and the life of the printhead mechanism significantly lengthened, by producing objects according to an alternative embodiment of the present invention which will now be described hereinbelow relative to FIGS. 14a, 14b, 15a, 15b and 16a through 16e.

Figure 14A:
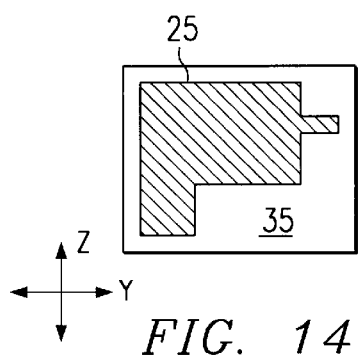
FIGS. 14a and 14b are cross-sectional views of an example of a three-dimensional object being produced according to another alternative embodiment of the invention.
Figure 14B:
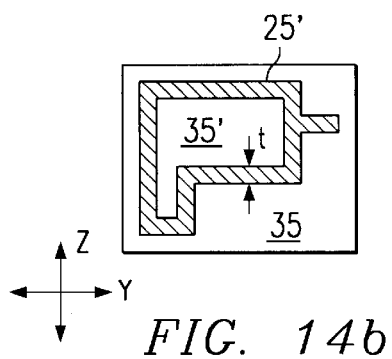

Referring first to FIGS. 14a and 14b, an object formed of object material 25 surrounded by support material 35 is shown in cross-section (in the y-z plane), at a stage in its manufacture prior to the dissolving of support material 35; it may be assumed for purposes of this discussion that this y-z cross-section is maintained for a sufficiently large range in the x-dimension. It is evident from the view of FIG. 14a that a large portion of the object is formed of a solid block of object material 25. In the fabrication of this object, therefore, printhead 20 dispenses object material 25 in a highly precise manner for much of the volume of the object, including the interior portion of the object, and as such, the fabrication of the object of FIG. 14 is quite slow. Furthermore, it is well known that inkjet reliability is a function of its time of use. Accordingly, it is preferred, not only from a manufacturing throughput standpoint but also from a system reliability standpoint, to minimize the time during which the inkjet is in use.

FIG. 14b illustrates, in the same y-z plane cross-section as shown in FIG. 14a, that the same object may alternatively be formed of a shell of object material 25' of thickness t surrounding filler support material 35'. The side walls (i.e., the x-dimension limits) of the object of FIG. 14b will also provide walls of thickness t. So long as object material 25 is both insoluble in the solvent used to dissolve support material 35 and also impervious to filler support material 35', the dissolving of support material 35 from outside of shell 25' will leave filler support material 35' intact within shell 25'. Examples of materials useful to form such a shell part include a water soluble wax, such as polyethylene glycol, for support material 35 and filler support material 35', and a water insoluble wax, such as beeswax or carnauba wax, for shell object material 25'.

Since filler support material 35' may be dispensed with much less precision than object material 25, such as by way of a spray nozzle or dispenser nozzle, the frequency of use of the inkjet printhead to form the object of FIG. 14b is much reduced from that required to form the object of FIG. 14a. As a result, the object of FIG. 14b may be formed in much less time than that of FIG. 14a, and with less wear of inkjet printhead 20 used to dispense object material 25.

Figure 15A:
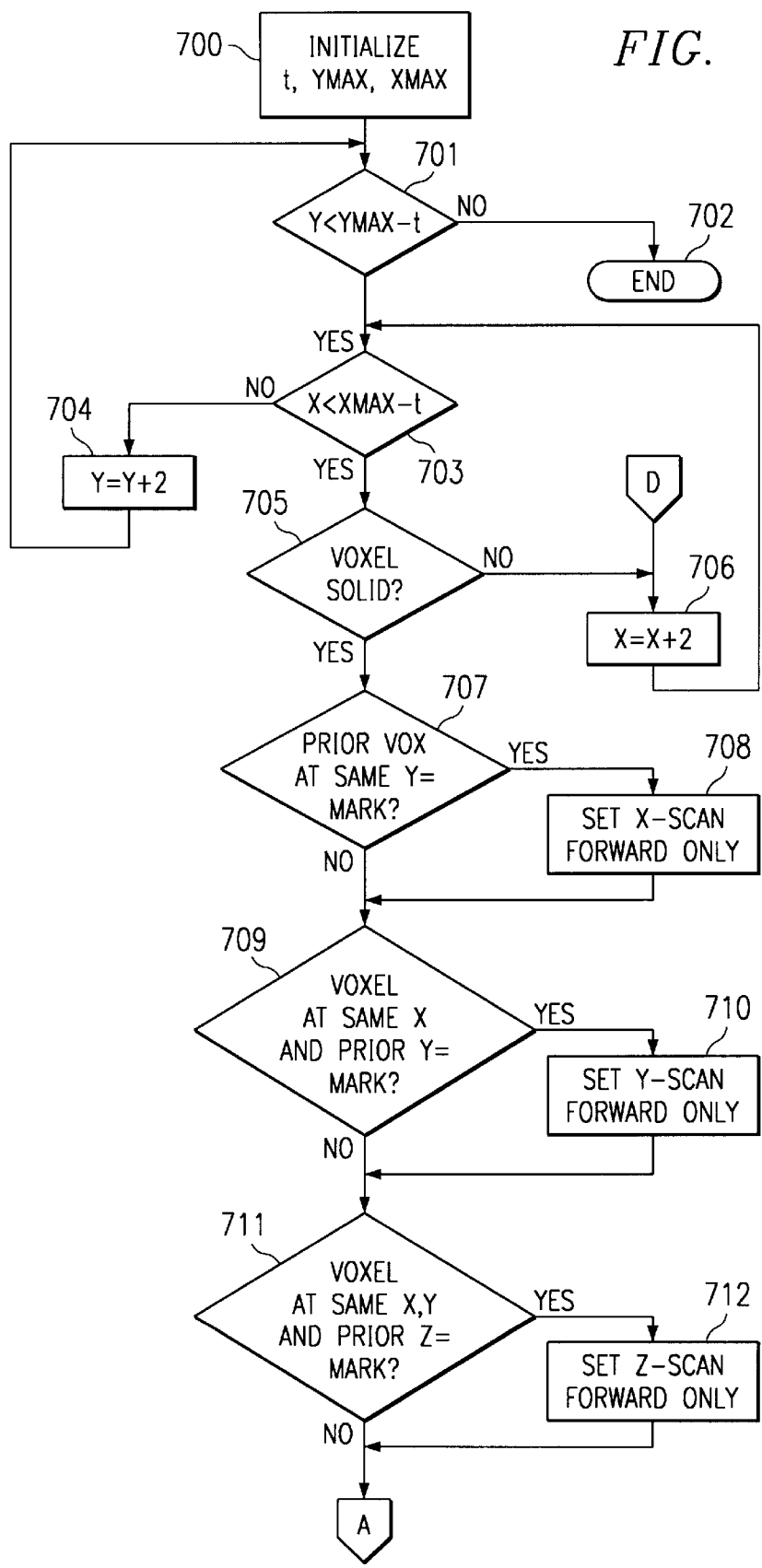
FIGS. 15a and 15b are a flow chart illustrating the operation of an alternative method of producing the three-dimensional object of FIGS. 14a and 14b.
Figure 15B:
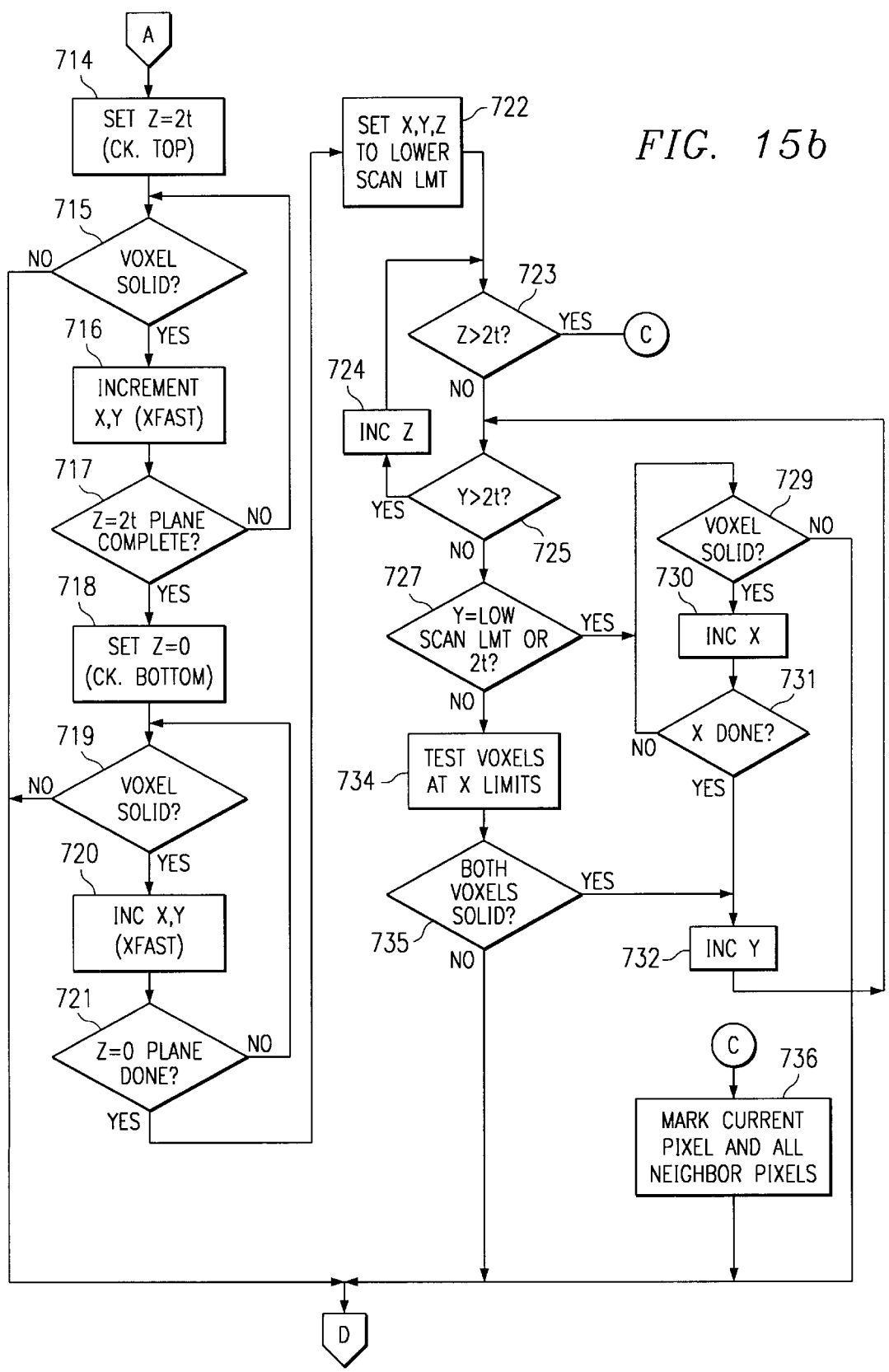

It is therefore contemplated that, by way of clever use of conventional computer-aided-design programs, the designer of the object to be formed may implement a shell design of a solid object in the original description of the design in the data base. However, it is preferred that the computer control system for the apparatus according to the present invention automatically generate a shell part, such as that shown in FIG. 14b, from the data base for a solid part, such as that shown in FIG. 14a, preferably with a user-specified thickness t. This conversion from solid to shell may be done off line, prior to initiation of the fabrication process, so that the data base received by the fabrication system is the shell data base; alternatively, conversion from solid to shell may be done on a layer-by-layer basis by the fabrication system itself, during the layerwise manufacture of the object. The methods described hereinbelow for such conversion, including the preferred method described relative to FIGS. 15a and 15b, are suitable for use in either environment.

Figure 16A:
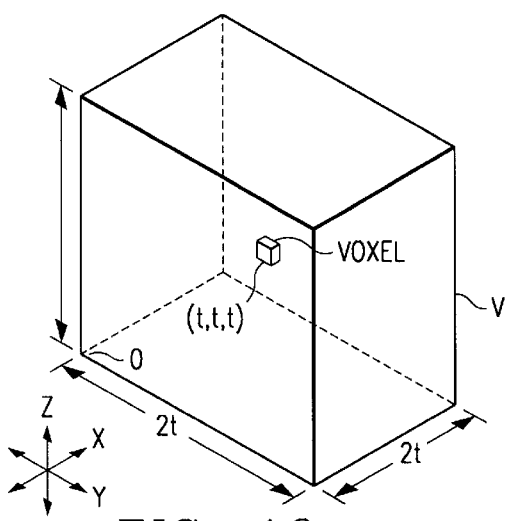
FIGS. 16a through 16d illustrate volumes surrounding a voxel being analyzed in the method of FIGS. 15a and 15b.

According to the preferred method for accomplishing such conversion, each voxel (volume element) in the volume is individually analyzed relative to its surrounding voxels to determine if the voxel of interest is within the user-specified thickness t of a voxel that is not part of the object. Referring to FIG. 16a, voxel of interest VOXEL is illustrated as the center of cube V which is 2t in length in each dimension. As such, voxel of interest VOXEL is the distance t away from each of the sides of cube V. In the context of converting a solid object to a hollow shell object, the present method determines if voxel of interest VOXEL and each of the voxels surrounding it in cube V are to be formed of object material 25; if so, voxel of interest VOXEL is at least thickness t away from any edge of the object to be formed, and thus may be formed of filler support material 35' rather than of object material 25. Incrementing the voxels of interest throughout the volume of the object to be formed will thus identify which of those voxels which previously were to be formed of object material 25 may be formed of filler support material 35' to form an object having walls no thinner than thickness t.

The analysis of a relatively large volume according to the "brute force" technique of examining each voxel within a cube V surrounding the voxel of interest VOXEL, while effective, is extremely cumbersome. Indeed, for a volume of n voxels, such a method would require on the order of $n^4$ interrogations, resulting in extremely long computing times. The method illustrated in the flow charts of FIGS. 15a and 15b is intended to perform the data conversion from solid to shell objects in significantly less time, by analyzing only the surfaces of cube V in the manner described hereinbelow. This method is suitable for operation on a modern personal computer workstation or other data processing system of similar computing power; it is further contemplated that one of ordinary skill in the art can readily program such a computer to perform this method, based on the following description.

This method is described hereinbelow relative to a slice of the object volume in the x-y plane, as suitable for use in a real-time conversion during the layerwise formation of the object. Alternatively, as noted above, if the conversion is performed off line prior to object manufacture, this process will be performed incrementally for a series of layers in the z-dimension. Furthermore, it is assumed that the data base upon which the conversion process of FIGS. 15a, 15b operates consists of memory locations corresponding to a three-dimensional array of voxels, each of which store a "hollow" or "solid" state, indicating that it is not to receive object material 25, or is to receive object material 25, respectively. According to this embodiment of the invention, a third "marked" state is utilized, indicating for the voxel that it is to receive filler support material 35'.

The conversion process according to this embodiment of the invention begins with process 700, in which the user-specified shell thickness t and the maximum x and y are set for a voxel in an x-y slice of the object volume. In decision 701, the current y value of the voxel of interest ("VOXEL") is interrogated to determine if it is located within the shell thickness t from the maximum y dimension ymax; if so, the conversion process ends, as voxels in this y-dimension are necessarily either hollow or within the shell of thickness t from a hollow voxel. If not, decision 703 is performed by which the x dimension of VOXEL is interrogated to see if it is within the shell thickness t of the maximum x dimension xmax. If VOXEL is within distance t of xmax, a new VOXEL is selected by incrementing the y value by two and returning control to decision 701. It has been observed that incrementing the x and y values of VOXEL by two will, of course, greatly speed up the conversion process by reducing in half the number of VOXELs interrogated; in addition, little resolution is lost by such incrementing, as only the undesirable situation of a hollow area of a single voxel's width is lost by incrementing by two.

If VOXEL is not within the shell thickness of the maximum value xmax, decision 705 is performed by which the solid object data base is interrogated to determine if VOXEL is solid. If not, a new VOXEL is selected by incrementing by two in the x-dimension, with control passing back to decision 703. If VOXEL is solid, it may be a candidate for conversion to a hollow VOXEL (i.e., a location to receive filler support material 35'), and the process will continue with decision 707.

Figure 16B:
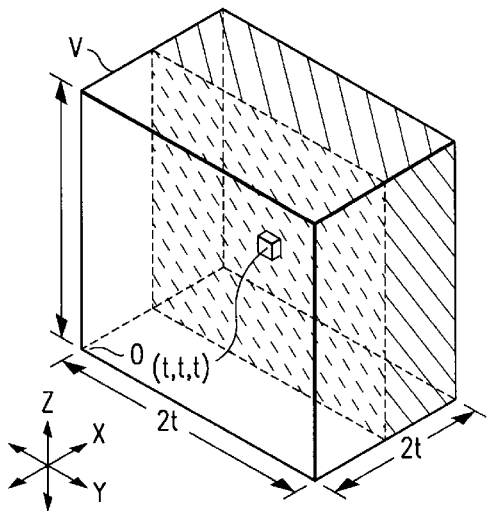

According to this embodiment of the invention, as indicated hereinabove, the surfaces of cube V are interrogated to determine if VOXEL may be marked. However, decision 707 begins a routine by which analysis of the surfaces of cube V may be reduced, based upon prior results. In decision 707, the prior voxel in the same y-dimension as VOXEL is interrogated to see if it has been "marked" to be filled in by filler support material. If so, those voxels at least t distance in the −x direction from VOXEL have already been interrogated and are to be filled with filler support material 35', eliminating the need for the interrogation to be repeated in the −x direction. An x-scan pointer is then set in process 708 so that only the surfaces of cube V in the +x direction from VOXEL need be interrogated to determine if VOXEL can be marked (i.e., the portions of the surfaces of cube V having x greater than or equal to t). The shaded surfaces illustrated in FIG. 16b show those portions which are to be analyzed if the result of decision 707 is positive, including substitution of an internal surface of cube V along the x=t plane in place of an external surface of cube V along the x=0 planar surface.

Figure 16C:
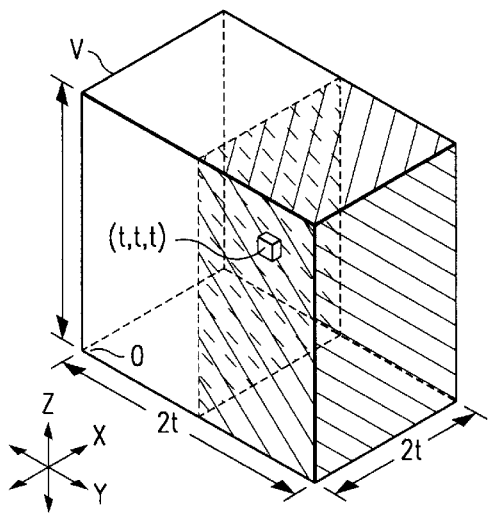

Referring back to FIG. 15a, decision 709 is then performed by which the voxel at the same x-dimension as VOXEL but at the prior y scan line is interrogated to determine if it was marked to become hollow. If so, the portions of those surfaces of cube V having a y-dimension less than that of VOXEL need not be analyzed, as prior analysis has found that the prior voxel in the y-dimension could be safely marked, and a y-scan pointer is set to scan forward only in the y-direction from VOXEL (process 710). FIG. 16c illustrates, by shading, the portions of the surfaces to be analyzed if the result of decision 709 is positive (i.e., y greater than or equal to VOXEL). An internal surface of cube V (along the y=t plane) is also considered, in lieu of the y=0 surface.

Figure 16D:
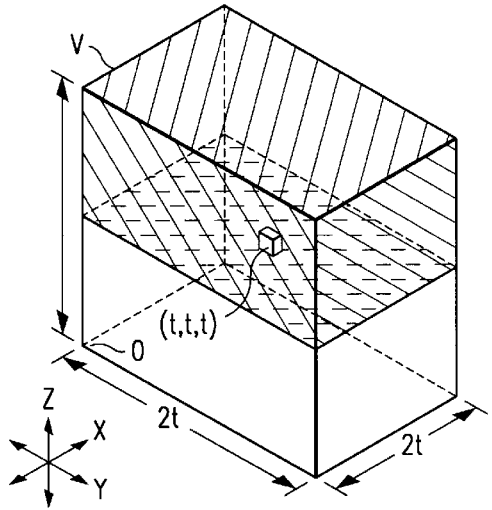
Figure 16E:
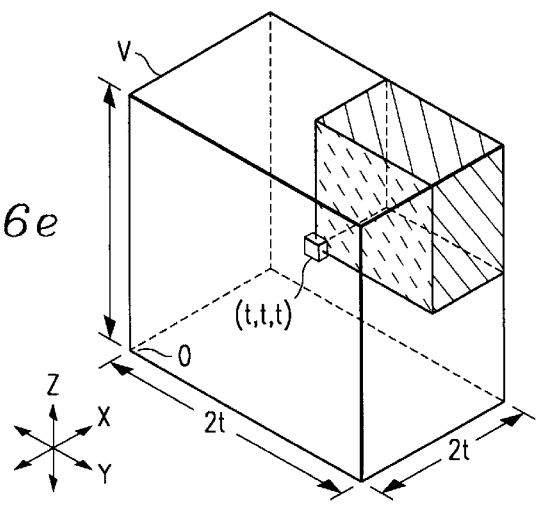

Decision 711 is then performed by which the voxel directly below VOXEL in the z-dimension is interrogated to determine if it was marked to become hollow. If so, similarly as in the x and y dimensions, a z-scan pointer is set in process 712 to scan forward only in the z-dimension, analyzing the portions of the surfaces of cube V having a z value greater than or equal to that of VOXEL. The shaded surfaces of FIG. 16d illustrate the portions of the surfaces of cube V which are to be analyzed in this case.

It should be noted that any combination of positive results may be returned from decisions 707, 709, 711, including the combinations of no positive result and the combination of all positive results. If all three voxels immediately adjacent to VOXEL in all three of the x, y and z dimensions are marked as hollow, only portions of the surfaces of cube V shown in FIG. 16e need be analyzed, namely those locations having all three of their x, y and z dimensions greater than that of VOXEL. Internal surfaces of cube V along the x=t, y=t and z=t planes are also included in the analysis. As a result, this portion of the method can greatly decrease the amount of analysis required to determine if VOXEL can be "marked".

Referring now to FIG. 15b, once the extent of the surfaces of cube V to be scanned has been determined, the analysis can begin. Process 714 sets the z value to 2t, corresponding to the top surface of cube V. Decision 715 then interrogates the voxel at the initial x, y location (depending upon the results of decisions 707, 709) of the top surface to determine if it is solid. If not, meaning that this voxel on the top surface is outside of the object region, VOXEL is necessarily within the distance t of the outer edge of the object to be formed, the process ends for VOXEL, and a new VOXEL is then interrogated after incrementing of the x-value in process 706. If this voxel at the top surface is solid, process 716 is performed by way of which the x and y values are incremented over the z=2t surface (in this case, with the x-axis being the fast axis). Decision 717 determines if the plane is complete, and if not returns control to decision 715 to analyze the next voxel.

If no voxel at the top surface (z=2t) is hollow, the bottom surface is analyzed by setting z to its lower limit in process 718 (to either 0 or t, according to the result of decision 711 described hereinabove). Decision 719 analyzes the state of each voxel along this bottom surface, to the extent analyzed due to the results of decisions 707, 709, and with decision 721 determining when the bottom surface analysis is complete. If any of the voxels of the bottom surface so analyzed are hollow, the process ends for VOXEL as it cannot be made hollow, and the incrementing of the voxel of interest is performed in process 706.

Upon completion of the bottom surface (assuming that no hollow voxels were found), control passes to process 722 which sets the x, y and z dimensions of the surface voxel to be analyzed to their lower limits found in decisions 707, 709, 711, to begin analysis of the side surfaces of cube V at the current z-value. Decision 723 determines if the z-value of the surface voxel has reached beyond 2t (the top of cube V), and if so, passes control to process 736 described below. If not, decision 725 next determines if the y value of the surface voxel to be analyzed exceeds 2t, indicating that a scan line is complete such that the z value must be incremented in process 724, with control passed to decision 723. If decision 725 indicates that the y value of the surface voxel has not exceeded 2t, decision 727 is performed in which the surface voxel y dimensions are examined to determine if it is resident on either of the surfaces in the x-z planes (i.e., y=2t or y=lower limit). If so, decision 729 is performed to analyze the surface voxel along the x-z surface, incrementing the x-value in process 730 until the x-z surfaces are complete, for the current z-value, as determined by decision 731. Of course, if any surface voxel is found to be hollow, VOXEL cannot be marked hollow and the next VOXEL is then selected (process 706). Upon completion of the x-dimension line in the x-z surface, the y value of the surface voxel to be analyzed is incremented by one in process 732, and the y value is tested in decisions 725 and 727 as before.

Upon decision 727 determining that the y value of the surface voxel to be analyzed is not in one of the x-z surfaces to be interrogated, only the x-limits (the x dimension lower scan limit and x=2t) are tested in process 734. If both voxels are solid, the y value is again incremented (process 732) and tested (decision 725, 727), with the next y-dimension line extremes tested again until y exceeds the 2t limit, in which case the z-value is incremented (process 724) and the method repeated.

In this manner, each voxel in the side (or internal, as the case may be) surfaces of cube V are analyzed slice-by-slice in the z-dimension, until the z value of the surface voxels reaches the terminal limit of 2t, at the top of cube V. If no voxel is found to be hollow in this analysis, VOXEL may be marked to become hollow in fabrication, as there is no voxel within distance t from VOXEL that is not either solid or marked to become hollow. Process 736 is then performed, by which VOXEL and its surrounding voxels are marked to become hollow when fabricated, by receiving filler support material 35' thereat.

As a result of this method of FIGS. 15a and 15b, the data base of the volume within which the object is to be formed may be automatically converted from that for a solid object to that for a shell object, such that filler support material 35' may be used in the interior portions of the object. This method thus improves the life of inkjet printheads used to dispense object material 25, and also greatly improves the rate at which objects may be produced.

Further improvement in the rate at which objects may be formed, as well as reduction in the amount of material used to form a part, according to the present invention may also be obtained by limiting the dispensing of support material 35. In particular, those locations of the object over which object material 25 will not be dispensed do not require the presence of support material 35 thereat. Referring now to FIGS. 17a through 17d, a process for limiting the dispensation of support material 35 to only those locations at which it is necessary to support object material 25 will now be described.

Figure 17A:
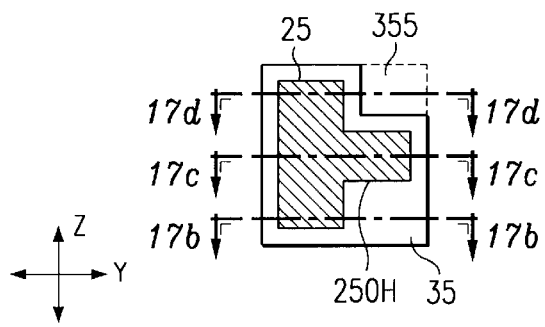
FIGS. 17a through 17d are cross-sectional views of an object being formed according to another alternative embodiment of the invention.

FIG. 17a illustrates a cross-section along the y-z plane of an object including object material 25 and support material 35. As is evident from FIG. 17a, overhang portion 25OH of object material 25 juts outwardly in the +y direction, and has a smaller width (in the z-dimension) than the remainder of the object. According to this alternative embodiment of the invention, region 35S above overhang 25OH does not contain support material 35, as it otherwise would if the object were formed without consideration of whether object material 25 is present thereover.

Figure 17B:
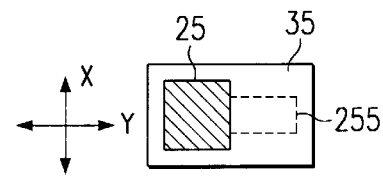
Figure 17C:
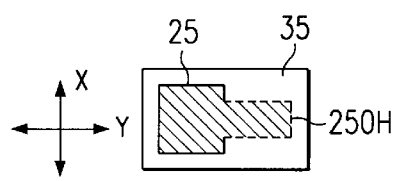
Figure 17D:
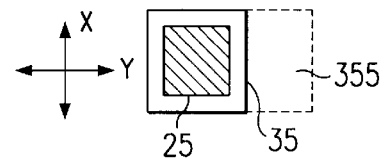

The cross-sectional views of FIGS. 17b through 17d, taken along the x-y plane, of the object of FIG. 17a illustrate this embodiment of the invention. This method of analysis of the object to be formed may be performed on a conventional personal computer workstation or data processing system of similar computing power. It is further contemplated that one of ordinary skill in the art, having reference to this description in combination with conventional computer-aided-design software, can readily practice this embodiment of the invention.

FIG. 17b illustrates a plan view of the object as it is being formed at a relatively low layer, below the height (in the z-direction) of overhang 25OH; this layer will be formed, in the method described hereinabove, prior to the layers including overhang 25OH. According to this embodiment of the invention, the computer workstation controlling the fabrication process analyzes a shadow projection of the object material 25 portions of the current layer being fabricated (shown by object material 25 in FIG. 17b) and all layers which are yet to be fabricated. As a result, shadow 25S appears corresponding to overhang 25OH, even though this layer of the object does not include overhang 25OH. As a result, support material will be provided as illustrated in FIG. 17b for this layer, including that amount of support material necessary to support overhang 25OH.

The fabrication method continues in a layerwise fashion, proceeding in the +z direction, as described hereinabove. FIG. 17c illustrates, in plan view, a layer of the object as it is being formed at the height of overhang 25OH; as such, object material 25 is dispensed as illustrated in FIG. 17c, with support material 35 surrounding. In addition, since in this example no higher layer of the object includes object material 25 outside of the bounds shown in FIG. 17c, no shadow is projected in this analysis.

FIG. 17d illustrates a layer above the height of overhang 25OH, again projecting a shadow view of its layer and all layers thereabove. As indicated in FIG. 17d, no shadow or actual projection of overhang 25OH is present, as overhang 25OH is fully below this level. In addition, no object material 25 will be necessary above region 355 of FIG. 17d, and thus dispenser 30 will be controlled so that no support material 35 is dispensed in region 355. This volume of support material 35 is then saved, as is the solvent and other processing necessary to deal therewith in resolving the object so formed.

The simplicity of a system, method, and process according to the present invention offers many advantages. The printheads are small, inexpensive and can be configured to several scan methods, including vector and raster. Ejector apertures are small, enabling very high resolution. Furthermore, wide apertures or ejector arrays can be utilized for high volume dispensing, as well as dispensing of high viscosity materials. Additionally, a system, method, and process according to the present invention can be tailored to various work environments and applications ranging from foundries and machine shops to small desktop systems. Because the media can be printed on any surface, automated conveyor and material handling systems can be incorporated. This enables fast and continuous throughput from multiple data sources. This includes multiple computer-generated images, on at least one computer, being rapidly prototyped by one or more systems built according to the teachings of the present invention.

Some of the innumerable objects which can be produced by this technique include prototypes, casting patterns, molds, sculptures, and structural components. It will quickly be apparent to those skilled in the art that this list is in no way exhaustive and that numerous other uses of the present invention will occur to those skilled in the art.

It should be understood that various embodiments of the invention can employ or be embodied in hardware, software or microcoded firmware. Process diagrams are also representative of flow diagrams for microcoded and software based embodiments. Further, while a specific embodiment of the invention has been shown and described, various modifications and alternate embodiments will occur to those skilled in the art. Accordingly, it is intended that the invention be limited only in terms of the appended claims.

What is claimed is:

1. An apparatus for producing a three-dimensional object, comprising:
   a platform for supporting a target surface; and
   an integrated printhead for forming a layer over said target surface, said integrated printhead movable relative to said platform, comprising:
      a first jet for controllably dispensing a first material at selected locations of said target surface; and
      a dispenser mounted on said printhead in a lagging spaced-apart relationship relative to said first jet in a direction of movement of said integrated printhead relative to said platform, for dispensing a second material at other locations of said target surface simultaneously with said first jet;
   wherein said integrated printhead further comprises:
      means for planarizing the layer formed by said first jet and said dispenser, to form a substantially planar target surface at the top surface of said layer.

2. The apparatus of claim 1, wherein said planarizing means comprises a knife mounted to said integrated printhead in a spaced-apart relationship relative to said first jet and said dispenser.

3. The apparatus of claim 2, wherein said integrated printhead further comprises means for removing residue produced by said knife.

4. The apparatus of claim 2, further comprising means for controllably raising and lowering said knife relative to said layer.

5. The apparatus of claim 2, wherein said knife is mounted in a leading position relative to said first jet in the direction of movement of said integrated printhead relative to said platform.

6. The apparatus of claim 5, wherein said knife comprises a plurality of cutting blades at varying depths, with the most shallow of said cutting blades leading the remainder of said plurality of cutting blades in the direction of travel.

7. The apparatus of claim 5, wherein said knife comprises a cutting blade sloped in such a manner that its shallowest portion leads its deepest portion in the direction of travel.

8. The apparatus of claim 1, wherein said planarizing means comprises:
   a roller mounted in a spaced-apart position relative to said first jet and said dispenser.

9. The apparatus of claim 8, wherein said roller is heated.

10. The apparatus of claim 1, wherein said planarizing means comprises a heater mounted in a spaced-apart relationship relative to said first jet and said dispenser.

11. The apparatus of claim 1, wherein said dispenser comprises a second jet.

12. A method of producing a three-dimensional object, comprising the steps of:
   moving an integrated printhead across a target surface, said integrated printhead comprising a first jet for controllably dispensing a liquid first material at said target surface and a dispenser for dispensing a liquid second material mounted on said printhead in a spaced-apart relationship relative to said first jet;
   during said moving step, controllably dispensing said first material via said first jet at selected locations of said target surface corresponding to a cross-section of the object, wherein said first material solidifies after being dispensed;
   during said dispensing, dispensing said second material via said dispenser at other locations of said target surface simultaneously at which said first jet is dispensing said first material, wherein said second material solidifies after being dispensed, to complete a layer over said target surface to form another target surface at a top surface of said first material; and
   repeating said moving, controllably dispensing to form a body comprised of said first and second materials;
   further comprising:
      planarizing said layer formed during said controllably dispensing to form a substantially planar target surface;
      wherein said planarizing step is performed during said moving step in a spaced-apart relationship relative to said first jet and said dispenser.

13. The method of claim 12, wherein said planarizing step is performed at locations of said target surface in advance of the location at which said first jet is dispensing said first material.

14. The method of claim 12, wherein said planarizing step is performed at locations of said target surface behind the location at which said dispenser is dispensing said second material.

* * * * *